(12) United States Patent
Mori et al.

(10) Patent No.: US 11,240,448 B2
(45) Date of Patent: Feb. 1, 2022

(54) SOLID-STATE IMAGING DEVICE, METHOD FOR DRIVING SOLID-STATE IMAGING DEVICE, AND ELECTRONIC APPARATUS

(71) Applicant: BRILLNICS SINGAPORE PTE. LTD., Singapore (SG)

(72) Inventors: Kazuya Mori, Tokyo (JP); Toshinori Otaka, Tokyo (JP); Isao Takayanagi, Tokyo (JP)

(73) Assignee: BRILLNICS SINGAPORE PTE. LTD., Singapore (SG)

(*) Notice: Subject to any disclaimer, the term of this patent is extended or adjusted under 35 U.S.C. 154(b) by 215 days.

(21) Appl. No.: 16/724,112

(22) Filed: Dec. 20, 2019

(65) Prior Publication Data

US 2020/0204749 A1 Jun. 25, 2020

(30) Foreign Application Priority Data

Dec. 25, 2018 (JP) .............................. JP2018-240728

(51) Int. Cl.
*H04N 5/355* (2011.01)
*H01L 27/146* (2006.01)
(Continued)

(52) U.S. Cl.
CPC ..... *H04N 5/3559* (2013.01); *H01L 27/14612* (2013.01); *H01L 27/14638* (2013.01);
(Continued)

(58) Field of Classification Search
CPC .. H04N 5/3559; H04N 5/37455; H04N 5/378; H04N 5/379; H04N 5/374;
(Continued)

(56) References Cited

U.S. PATENT DOCUMENTS 7,164,114 B2  1/2007 Lai et al.
2004/0251394 A1* 12/2004 Rhodes .............. H04N 5/35572
                                                       250/208.1
(Continued)

FOREIGN PATENT DOCUMENTS

JP  2005278135 A  10/2005
JP  2005295346 A  10/2005
(Continued)

OTHER PUBLICATIONS

European Patent Office, Official Action issued in EP Patent Application No. 19219644.2; dated Jun. 8, 2021, pp. 1-5.
(Continued)

*Primary Examiner* — Albert H Cutler
(74) *Attorney, Agent, or Firm* — Pillsbury Winthrop Shaw Pittman LLP

(57) ABSTRACT

Provided is a solid-state imaging device. A comparator is configured to perform a first comparing operation of outputting a digital first comparison result signal obtained by processing the overflow charges overflowing from PD1 to FD1 in the storing period, a second comparing operation of outputting a digital second comparison result signal obtained by processing the charges stored in PD1 that are transferred to FD1 in the transfer period, and a third comparing operation of outputting a digital third comparison result signal obtained by processing the charges stored in PD1 that are transferred to FD1 in the transfer period and the charges stored in the charge storing part, and a memory control part controls whether or not to allow writing of the data corresponding to the third comparison result signal into a memory part, depending on the states of the first and second comparison result signals.

23 Claims, 35 Drawing Sheets

(51) Int. Cl.
   *H04N 5/3745* (2011.01)
   *H04N 5/378* (2011.01)
   *H04N 5/369* (2011.01)
   *H04N 5/374* (2011.01)

(52) U.S. Cl.
   CPC ....... *H01L 27/14643* (2013.01); *H04N 5/378* (2013.01); *H04N 5/37455* (2013.01)

(58) Field of Classification Search
   CPC .. H04N 5/3745; H04N 5/23245; H04N 5/359; H04N 5/3591; H04N 5/3592; H01L 27/14612; H01L 27/14638; H01L 27/14643
   See application file for complete search history.

(56) References Cited

U.S. PATENT DOCUMENTS

| | | |
|---|---|---|
| 2005/0195304 A1 | 9/2005 | Nitta et al. |
| 2008/0266434 A1 | 10/2008 | Sugawa et al. |
| 2010/0181464 A1 | 7/2010 | Veeder |
| 2018/0152650 A1 | 5/2018 | Sakakibara et al. |
| 2018/0191974 A1* | 7/2018 | Shim ........................ H04N 5/345 |
| 2019/0014276 A1* | 1/2019 | Cheung ................ H04N 5/3575 |
| 2019/0230294 A1* | 7/2019 | Singh ................... H04N 5/3559 |
| 2019/0246057 A1* | 8/2019 | Ebihara ................. H04N 5/378 |
| 2019/0373168 A1* | 12/2019 | Balar ................... H04N 5/3559 |
| 2019/0376845 A1* | 12/2019 | Liu ..................... H04N 5/35554 |
| 2020/0043971 A1 | 2/2020 | Sugawa et al. |
| 2020/0186732 A1* | 6/2020 | Takizawa ............. H04N 5/3559 |

FOREIGN PATENT DOCUMENTS

| | | |
|---|---|---|
| JP | 4317115 B2 | 8/2009 |
| WO | 2018/066143 A1 | 4/2018 |
| WO | 2019/241205 A1 | 12/2019 |

OTHER PUBLICATIONS

European Patent Office, Extended European Search Report for EP Application No. 19219644.2, dated Mar. 24, 2020, pp. 1-10.

* cited by examiner

Light to time conversion plot at various reference voltage at comparator input

Signal charge Q and Potential digaram

Signal charge Q and Potential diagram.

| Light level | Intensity range [lux] | Qpd [Ke] | Qfd [Ke] | Q max [Ke] | Mem1 Code p | Mem2 Code n |
|---|---|---|---|---|---|---|
| Low | dark~5e2 | <2 | 0 | 2 | 0-255 | 0 |
| Mid | 5e2~1.6e4 | >2 | <62 | <62 | 0-255 | 2 |
| High | 1.6e4~4e5 | >2 | <62 | <15872 | 0-255 | 1 |

FIG. 17

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2018-240728 (filed on Dec. 25, 2018), the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensor includes, for each pixel, a photodiode (a photoelectric conversion element) and a floating diffusion (FD) amplifier having a floating diffusion (FD). The mainstream design of the reading operation in the CMOS image sensor is a column parallel output processing of selecting one of the rows in the pixel array and reading the pixels in the selected row simultaneously in the column output direction.

To improve characteristics, various methods have been proposed for fabricating a CMOS image sensor that has a wide dynamic range and provides a high picture quality (see, for example, Japanese Patent No. 4317115 ("the '115 Patent")).

The '115 patent discloses a solid-state imaging device including a photodiode PD and a storage capacitor Cs and is configured such that the signal charges are retained in the storage capacitor Cs, which has a higher capacitance density than the photodiode PD, to increase the maximum level of the signal so that a wider dynamic range can be achieved.

In the above-mentioned solid-state imaging device, when the illuminance is high, the charges overflowing from the photodiode PD are retained in the storage capacitor Cs. The high-illuminance signal corresponding to the charges that have overflown into the storage capacitor Cs is read out with a low conversion gain (LCG (FD capacitance CFd+Cs)). A low-illuminance signal is read out with a high conversion gain (HCG (FD capacitance CFd)).

Various types of pixel signal reading (output) circuits have been proposed for CMOS image sensors of the column parallel output scheme. Among them, one of the most advanced circuits is a circuit that includes an analog-to-digital converter (ADC) for each column and obtains a pixel signal in a digital format (see, for example, Japanese Patent Application Publications Nos. 2005-278135 ("the '135 Publication") and 2005-295346 ("the '346 Publication")).

In this CMOS image sensor having column-parallel ADCs (column-wise-AD CMOS image sensor), a comparator compares the pixel signal against a so-called RAMP wave and a counter of a later stage performs digital CDS, so that AD conversion is performed.

This type of CMOS image sensors is capable of transferring signals at high speed, but disadvantageously are not capable of reading the signals with a global shutter.

To address this issue, a digital pixel sensor has been proposed that has, in each pixel, an ADC including a comparator (and additionally a memory part) so that the sensor can realize a global shutter according to which the exposure to light can start and end at the same timing in all of the pixels of the pixel array part (see, for example, U.S. Pat. No. 7,164,114 B2 (FIG. 4) and US 2010/0181464 A1).

For the solid-state imaging devices disclosed in the '115 Patent, the '135 Publication, and the '346 Publication, however, it is difficult to realize a global shutter function. In addition, there is a limitation to the efforts to achieve a wider dynamic range and a higher frame rate since the charges overflowing from the photodiodes in the storing period are not used real time, for example.

A CMOS image sensor having the above-mentioned conventional digital pixel sensor can realize a global shutter function, but there is a limitation to the efforts to achieve a wider dynamic range and a higher frame rate since the charges overflowing from the photodiodes in the storing period are not used real time, for example.

One of the key performance indices of the CMOS image sensor is random noise, which mainly originates from the pixels and ADCs as is known in the art. It is generally known that the random noise can be reduced by increasing the transistor size to reduce flicker noise or by adding a capacitor to the output of the comparator to lower the band so that the CDS effectively serves as a noise filter. Due to the increased area and capacitance, however, these techniques experience worse inversion delay in the comparator. This disadvantageously encounter difficulties in raising the frame rate of the imaging element.

The memory part for storing the data resulting from the AD conversion needs to be formed by an n-bit memory such as an 8-bit or 12-bit memory. For example, when the pixel signal is read out in multiple stages such as two stages, the memory part requires a capacity of 2n bits in total, for example. Considering the digital CDS, the memory part requires an even larger capacity of 4n bits, for example. Accordingly, it is necessary to efficiently access the memory compatible with the AD conversion.

Furthermore, since each pixel has an ADC including a comparator (additionally, a memory part), it is difficult to maximize the effective pixel region and the value per cost.

SUMMARY

The present invention is to solve or mitigate at least a part of the above-mentioned problems. One of more specific objects of the present invention is to provide a solid-state imaging device, a method for driving a solid-state imaging device, and an electronic apparatus that are capable of substantially achieving a widened dynamic range and a raised frame rate and making efficient access to memory. The present invention is also to provide a solid-state imaging device, a method for driving a solid-state imaging device, and an electronic apparatus that are capable of substantially realizing a wider dynamic range and a higher frame rate, making efficient access to memory, realizing reduced noise and maximizing the effective pixel region and the value per cost.

A first aspect of the present invention provides a solid-state imaging device including a pixel part having a pixel arranged therein, where the pixel performs photoelectric conversion, and a reading part for reading a pixel signal from the pixel in the pixel part. The pixel includes a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges at the output node into a voltage signal at a level determined by the amount of the charges and outputting the voltage signal, a charge storing part for storing overflow charges overflowing at least from the photoelectric conversion element to the output node, a comparator for performing a comparing operation of comparing the voltage signal output from the output buffer part against a referential voltage to output a digital comparison result signal, a memory part for saving data corresponding to the comparison result signal from the comparator, and a memory control part for controlling access to the memory part depending on a state of the comparison result signal from the comparator. The comparator is configured to perform, under control of the reading part, a first comparing operation for outputting a digital first comparison result signal obtained by processing the voltage signal corresponding to the overflow charges overflowing from the photoelectric conversion element to the output node in the storing period, a second comparing operation for outputting a digital second comparison result signal obtained by processing the voltage signal corresponding to charges stored in the photoelectric conversion element that are transferred to the output node in the transfer period following the storing period, and a third comparing operation for outputting a digital third comparison result signal obtained by processing the voltage signal corresponding to a sum of (i) the charges stored in the photoelectric conversion element that are transferred to the output node in the transfer period following the storing period and (ii) charges stored in the charge storing part. The memory control part controls whether or not to allow writing of data corresponding to the third comparison result signal obtained as a result of the third comparing operation into the memory part, depending on a state of the first comparison result signal obtained as a result of the first comparing operation and a state of the second comparison result signal obtained as a result of the second comparing operation.

A second aspect of the present invention provides a method for driving a solid-state imaging device including a pixel part having a pixel arranged therein, where the pixel performs photoelectric conversion, and a reading part for reading a pixel signal from the pixel in the pixel part. The pixel includes a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges at the output node into a voltage signal at a level determined by the amount of the charges and outputting the voltage signal, a charge storing part for storing overflow charges overflowing at least from the photoelectric conversion element to the output node, a comparator for performing a comparing operation of comparing the voltage signal output from the output buffer part against a referential voltage to output a digital comparison result signal, and a memory part for saving data corresponding to the comparison result signal from the comparator. When the pixel signal is read out from the pixel, in the comparator, under control of the reading part, a first comparing operation of outputting a digital first comparison result signal obtained by processing the voltage signal corresponding to the overflow charges overflowing from the photoelectric conversion element to the output node in the storing period, a second comparing operation of outputting a digital second comparison result signal obtained by processing the voltage signal corresponding to charges stored in the photoelectric conversion element that are transferred to the output node in the transfer period following the storing period, and a third comparing operation of outputting a digital third comparison result signal obtained by processing the voltage signal corresponding to a sum of (i) the charges stored in the photoelectric conversion element that are transferred to the output node in the transfer period following the storing period and (ii) charges stored in the charge storing part are performed. Whether or not to allow writing of data corresponding to the third comparison result signal obtained as a result of the third comparing operation into the memory part is controlled depending on a state of the first comparison result signal obtained as a result of the first comparing operation and a state of the second comparison result signal obtained as a result of the second comparing operation, so that access to the memory part is controlled depending on a state of the comparison result signal from the comparator.

A third aspect of the present invention provides an electronic apparatus including a solid-state imaging device, and an optical system for forming a subject image on the solid-state imaging device. The solid-state imaging device includes a pixel part having a pixel arranged therein, where the pixel performs photoelectric conversion, and a reading part for reading a pixel signal from the pixel in the pixel part. The pixel includes a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges at the output node into a voltage signal at a level determined by the amount of the charges and outputting the voltage signal, a charge storing part for storing overflow charges overflowing at least from the photoelectric conversion element to the output node, a comparator for performing a comparing operation of comparing the voltage signal output from the output buffer part against a referential voltage to output a digital comparison result signal, a memory part for saving data corresponding to the comparison result signal from the comparator, and a memory control part for controlling access to the memory part depending on a state of the comparison result signal from the comparator. Under control of the reading part, the comparator is configured to perform a first comparing operation of outputting a digital first comparison result signal obtained by processing the voltage signal corresponding to the overflow charges overflowing from the photoelectric conversion element to the output node in the storing period, a second comparing operation of outputting a digital second comparison result signal obtained by processing the voltage signal corresponding to charges stored in the photoelectric conversion element that are transferred to the output node in the transfer period following the storing period, and a third comparing operation of outputting a digital third comparison result signal obtained by processing the voltage signal corresponding to a sum of (i) the charges stored in the photoelectric conversion element that are transferred to the output node in the transfer period following the storing period and (ii) charges stored in the charge storing part. The memory control part controls whether or not to allow writing of data corresponding to the third comparison result signal obtained as a result of the third comparing operation into the memory part, depending on a state of the first comparison result signal obtained as a result of the first comparing operation and a state of the second comparison result signal obtained as a result of the second comparing operation.

Advantages

The present invention is capable of substantially achieving a widened dynamic range and a raised frame rate and, additionally, making efficient access to memory. Additionally, the present invention is capable of substantially achieving a widened dynamic range and a raised frame rate, making efficient access to memory, achieving reduced noise, and maximizing the effective pixel region and the value per cost.

BRIEF DESCRIPTION OF THE DRAWINGS

FIG. 17 shows, as an example, status information indicating an operational mode stored in a second memory in association with various levels of light intensity in the first embodiment.

DESCRIPTION OF THE EMBODIMENTS

Embodiments of the present invention will be hereinafter described with reference to the drawings.

First Embodiment

Figure 1:
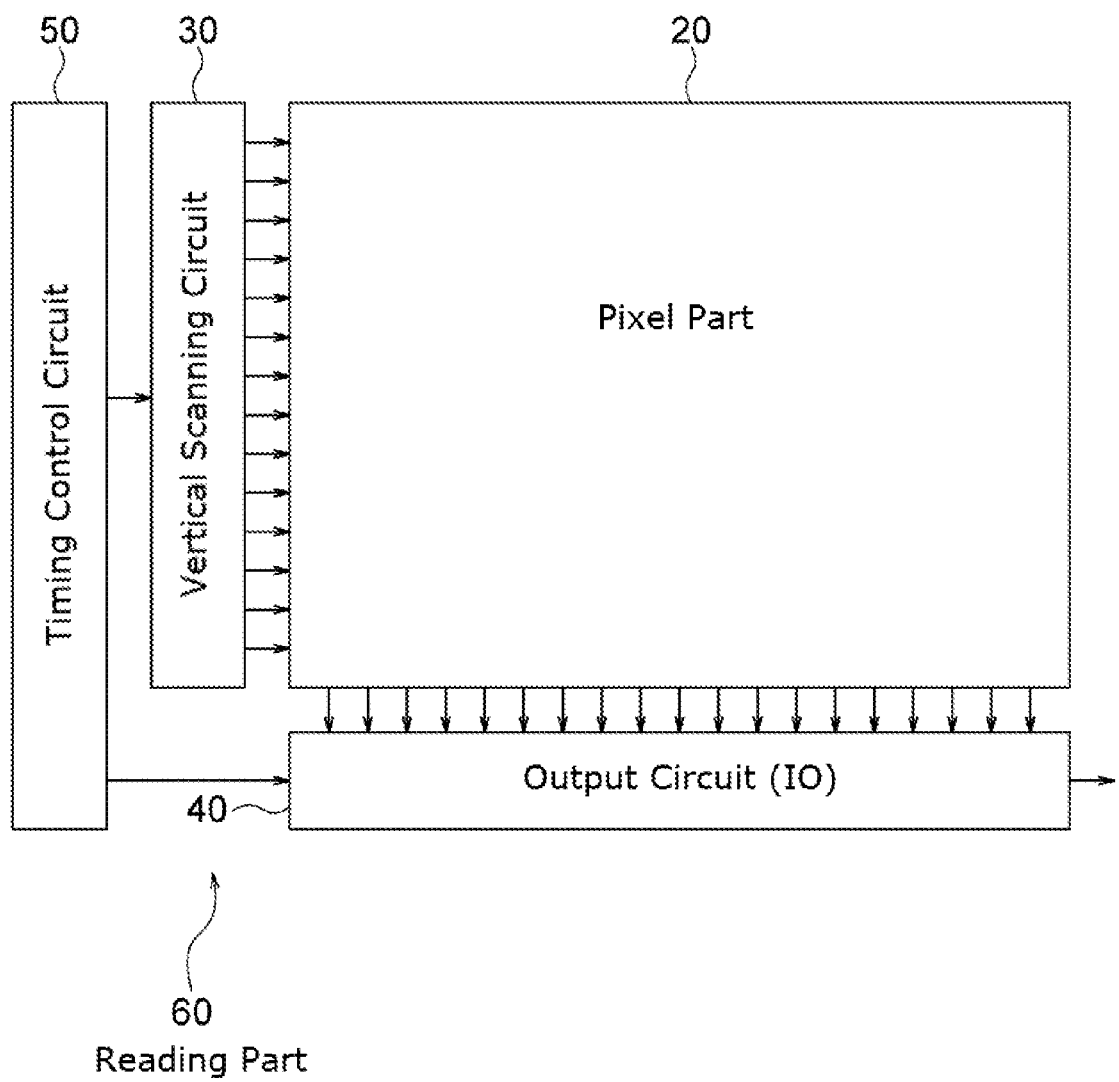
FIG. 1 is a block diagram showing an example configuration of a solid-state imaging device according to a first embodiment of the present invention.

FIG. 1 is a block diagram showing an example configuration of a solid-state imaging device according to a first embodiment of the present invention. In this embodiment, the solid-state imaging device 10 is constituted by, for example, a CMOS image sensor having a digital pixel as a pixel thereof.

As shown in FIG. 1, the solid-state imaging device 10 is constituted mainly by a pixel part 20 serving as an image capturing part, a vertical scanning circuit (a row scanning circuit) 30, an output circuit 40, and a timing control circuit 50. Among these components, for example, the vertical scanning circuit 30, the output circuit 40, and the timing control circuit 50 constitute a reading part 60 for reading pixel signals.

In the solid-state imaging device 10 relating to the first embodiment, the pixel part 20 includes digital pixels, and each digital pixel includes a photoelectric conversion reading part, an analog-to-digital (AD) converting part, and a memory part. The solid-state imaging device 10 is configured, for example, as a stacked CMOS image sensor capable of operating in a global shutter mode. In the solid-state imaging device 10 relating to the first embodiment, as will be described in detail below, each digital pixel DP has an AD converting function, and the AD converting part includes a comparator for performing a comparing operation of comparing the voltage signal read out by the photoelectric conversion reading part against a referential voltage and outputting a digital comparison result signal. Under the control of the reading part 60, the comparator performs a first comparing operation, a second comparing operation and a third comparing operation. The first comparing operation is designed to output a digital first comparison result signal obtained by processing the voltage signal corresponding to the overflow charges that overflow from the photoelectric conversion element to the output node (floating diffusion) in a storing period. The second comparing operation is designed to output a digital second comparison result signal obtained by processing the voltage signal corresponding to the charges stored in the photoelectric conversion element that are transferred to the output node in a transfer period following the storing period. The third comparing operation is designed to output a digital third comparison result signal obtained by processing the voltage signal corresponding to the sum of the charges stored in the charge storing part and the charges stored in the photoelectric conversion element that are transferred to the output node in the transfer period following the storing period.

The solid-state imaging device 10 further includes a memory control part for controlling access made to the memory part depending on a state (in the present embodiment, the level) of the comparison result signal from the comparator. The memory control part then controls whether or not to allow writing of the data corresponding to the second comparison result signal obtained as a result of the second comparing operation into the memory part, depending on the state of the first comparison result signal obtained as a result of the first comparing operation. More specifically, the memory control part prohibits the writing of the data corresponding to the second comparison result signal obtained as a result of the second comparing operation into the memory part, if the level of the first comparison result signal obtained as a result of the first comparing operation changes from a first level to a second level in the first comparing operation period. On the other hand, the memory control part allows the writing of the data corresponding to the second comparison result signal obtained as a result of the second comparing operation into the memory part, if the level of the first comparison result signal obtained as a result of the first comparing operation stays at and does not change from the first level in the first comparing operation period.

The memory control part relating to the present embodiment controls whether or not to allow writing of the data corresponding to the third comparison result signal obtained as a result of the third comparing operation into the memory part, depending on the state of the first comparison result signal obtained as a result of the first comparing operation and the state of the second comparison result signal obtained as a result of the second comparing operation. More specifically, the memory control part allows the writing of the data corresponding to the third comparison result signal obtained as a result of the third comparing operation into the memory part, if the level of the second comparison result signal obtained as a result of the second comparing operation stays at and does not change from the second level in the second comparing operation period.

The following outlines the configurations and functions of the parts of the solid-state imaging device 10. In particular, the configurations and functions of the pixel part 20 and the digital pixel and the relating reading operation will be described in detail, and the stacked structure of the pixel part 20 and the reading part 60 and other features will be also described in detail.

<Configurations of Pixel Part 20 and Digital Pixel 200>

Figure 2:
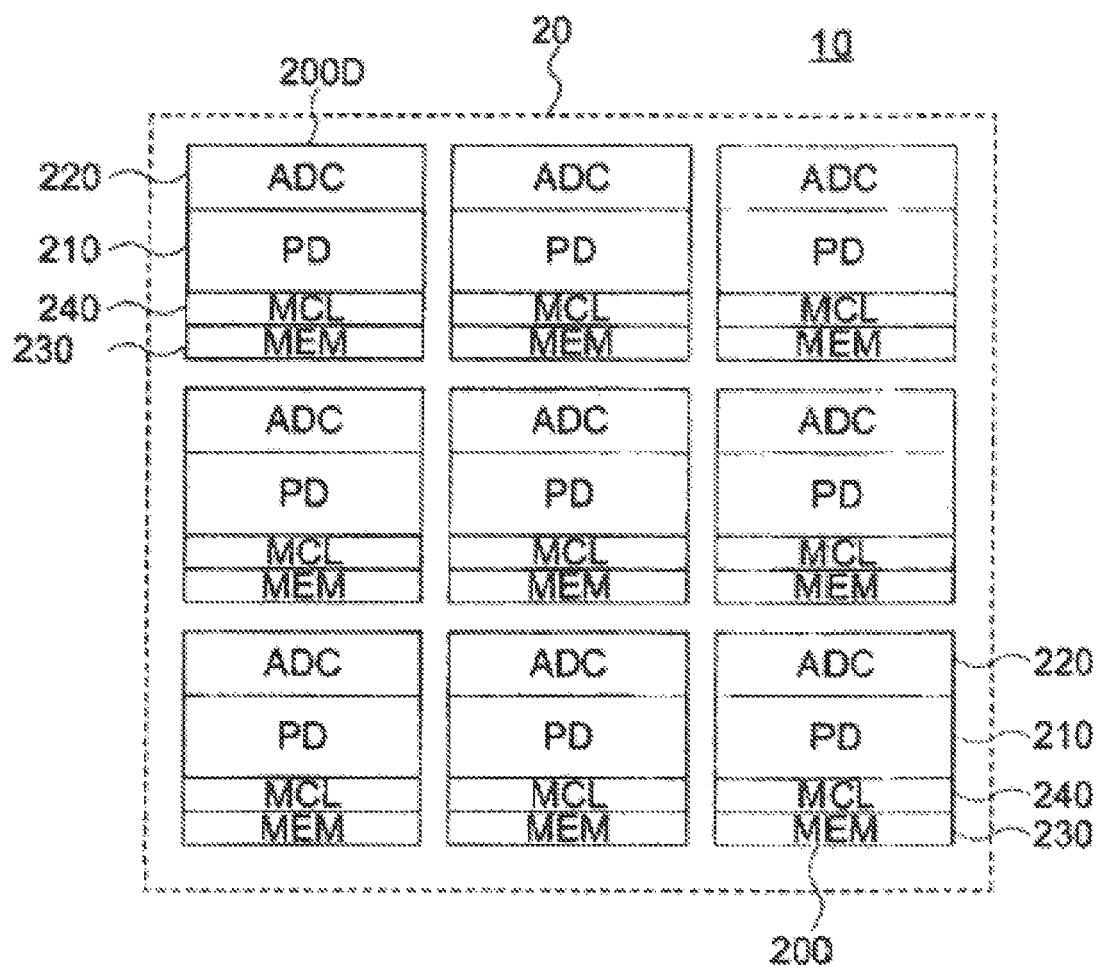
FIG. 2 shows an example of a digital pixel array of a pixel part of a solid-state imaging device relating to the first embodiment of the present invention.
Figure 3:
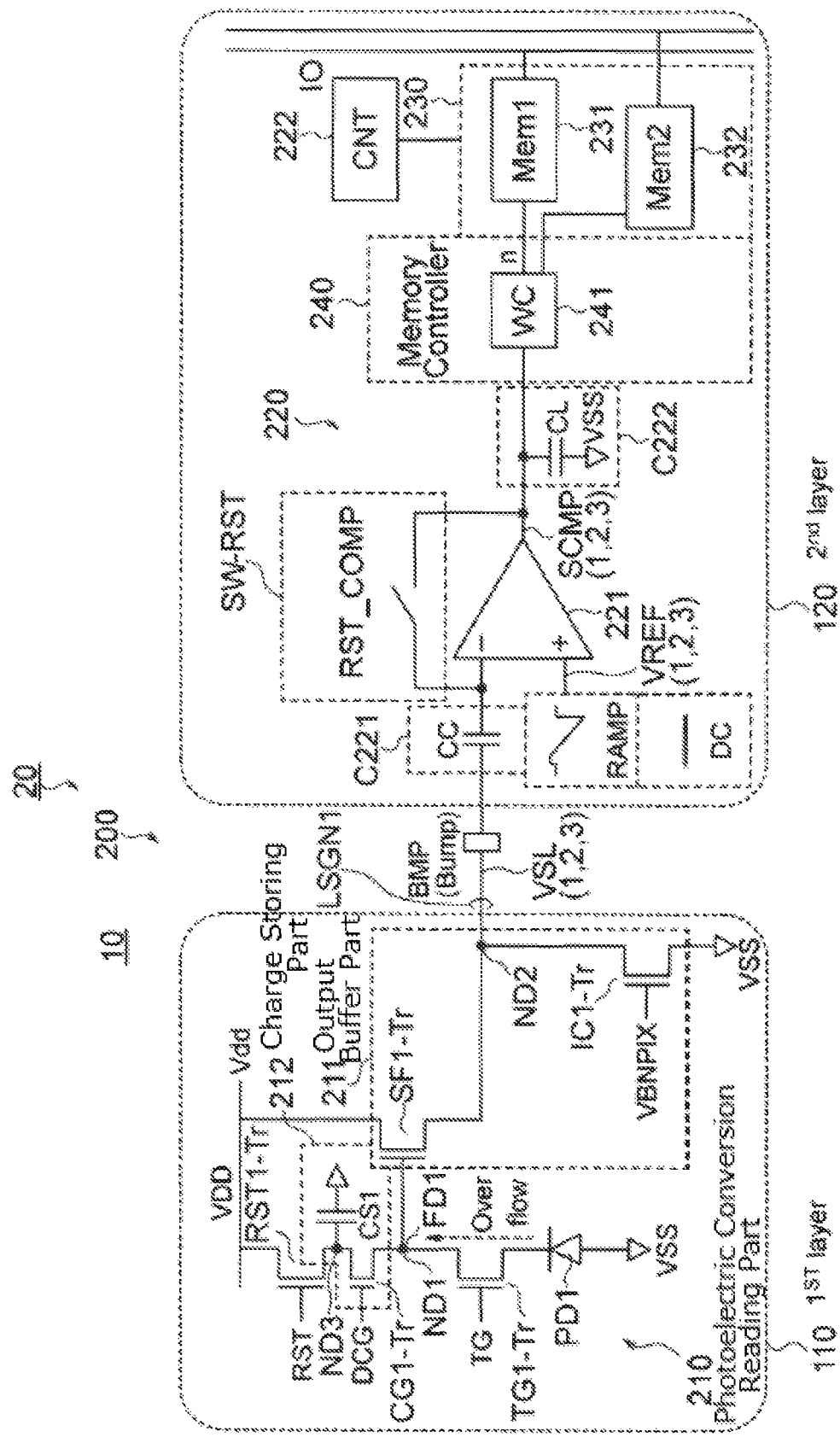
FIG. 3 is a circuit diagram showing an example of a pixel of the solid-state imaging device relating to the first embodiment of the present invention.

FIG. 2 shows an example of the digital pixel array of the pixel part of the solid-state imaging device 10 relating to the first embodiment of the present invention. FIG. 3 is a circuit diagram showing an example of the pixel of the solid-state imaging device 10 relating to the first embodiment of the present invention.

In the pixel part 20, as shown in FIG. 2, a plurality of digital pixels 200 are arranged in a matrix of N rows and M columns. FIG. 2 shows an example where nine digital pixels 200 are arranged in a matrix of three rows and three columns (M=3, N=3) for the sake of simplicity.

The digital pixel 200 relating to the first embodiment includes a photoelectric conversion reading part (identified as "PD" in FIG. 2) 210, an AD converting part (identified as "ADC" in FIG. 2) 220, a memory part (identified as "MEM" in FIG. 2) 230 and a memory control part (identified as "MCL" in FIG. 2) 240. The pixel part 20 relating to the first embodiment is configured as a stacked CMOS image sensor made up by a first substrate 110 and a second substrate 120, as will be described in detail below. In the present example, as shown in FIG. 3, the photoelectric conversion reading part 210 is formed in the first substrate 110, and the AD converting part 220, the memory part 230 and the memory control part 240 are formed in the second substrate 120.

The photoelectric conversion reading part 210 of the pixel 200 includes a photodiode (a photoelectric conversion element) and an in-pixel amplifier. More specifically, the photoelectric conversion reading part 210 includes, for example, a photodiode PD1, which is a photoelectric conversion element. For the photodiode PD1, one transfer transistor TG1-Tr serving as a transferring element, one reset transistor RST1-Tr serving as a resetting element, one source follower transistor SF1-Tr serving as a source follower element, one current transistor IC1-Tr serving as a current source element, one storage transistor CG1-Tr, one storage capacitor CS1 serving as a storage capacitor element, one floating diffusion FD1 serving as an output node ND1, and one reading node ND2 are provided. As described above, the photoelectric conversion reading part 210 of the digital pixel 200 relating to the first embodiment includes five transistors (5Tr), namely, the transfer transistor TG1-Tr, the reset transistor RST1-Tr, the source follower transistor SF1-Tr, the current transistor IC1-Tr and the storage transistor CG1-Tr.

In the first embodiment, the source follower transistor SF1-Tr, the current transistor IC1-Tr, and the reading node ND2 together constitute an output buffer part 211. The storage transistor CG1-Tr and the storage capacitor CS1 serving as a storage capacitor element together constitute a charge storing part 212.

In the photoelectric conversion reading part 210 relating to the first embodiment, the reading node ND2 of the output buffer part 211 is connected to the input part of the AD converting part 220. The photoelectric conversion reading part 210 converts the charges in the floating diffusion FD1 serving as an output node into a voltage signal at a level corresponding to the amount of the charges and outputs the voltage signal VSL to the AD converting part 220.

More specifically, the photoelectric conversion reading part 210 outputs, in a first comparing operation period PCMPR1 of the AD converting part 220, a voltage signal VSL corresponding to the overflow charges overflowing from the photodiode PD1, which is a photoelectric conversion element, to the floating diffusion FD1 serving as an output node in a storing period PI.

Furthermore, the photoelectric conversion reading part 210 outputs, in a second comparing operation period PCMPR2 of the AD converting part 220, a voltage signal VSL corresponding to the charges stored in the photodiode PD1 that are transferred to the floating diffusion FD1 serving as an output node in the transfer period PT following the storing period PI. The photoelectric conversion reading part 210 outputs a read-out reset signal (signal voltage) (VRST) and a read-out signal (signal voltage) (VSIG), as a pixel signal, to the AD converting part 220 in the second comparing operation period PCMPR2.

Furthermore, the photoelectric conversion reading part 210 outputs, in a third comparing operation period PCMPR3 of the AD converting part 220, a voltage signal VSL corresponding to the sum of (adding together) the charges stored in the storing part 2122 and the charges stored in the photodiode PD1 that are transferred to the floating diffusion FD1 serving as an output node in the transfer period PT following the storing period PI. The photoelectric conversion reading part 210 outputs a read-out reset signal (signal voltage) (VRST) and a read-out signal (signal voltage) (VSIG), as a pixel signal, to the AD converting part 220 in the third comparing operation period PCMPR3.

More specifically, the photoelectric conversion reading part 210 performs a first conversion gain reset reading operation HCGRRD in a first reset period PR1 to read, from the output buffer part 211, a first read-out reset signal HCGVRST that is obtained by conversion with a first conversion gain (for example, a high conversion gain: HCG) determined by a first amount of charges at the floating diffusion FD1, which is the output node ND1. The photoelectric conversion reading part 210 performs a first conversion gain signal reading operation HCGSRD in a reading period PRD following the transfer period PT1 after the first reset period PR1 to read, from the output buffer part 211 a first read-out signal HCGVSIG that is obtained by conversion with the first conversion gain (HCG) determined by the first amount of charges at the floating diffusion FD1, which is the output node ND1.

Subsequently, the photoelectric conversion reading part 210 performs a second conversion gain signal reading operation LCGSRD to read, from the output buffer part 211, a second read-out signal LCGVSIG2 that is obtained by conversion with a second conversion gain (for example, a low conversion gain: LCG) determined by a second amount of charges equal to the sum of the charges at the storage capacitor CS1 and the charges at the floating diffusion FD1, which is the output node ND1. After this, the photoelectric conversion reading part 210 performs a second conversion gain reset reading operation LCGRRD in a second reset period PR2 to read, from the output buffer part 211, a second read-out reset signal LCGVRST that is obtained by conversion with a second conversion gain (LCG) determined by the second amount of charges.

As described above, in the first embodiment, the solid-state imaging device 10 operates in a time stamp (TS) mode in the first comparing operation period PCMPR1 of the AD converting part 220, operates in an HCG (a first conversion gain) mode in the second comparing operation period PCMPR2, and operates in an LCG (second conversion gain) mode in the third comparing operation period PCMPR3.

The photodiode PD1 generates signal charges (electrons) in an amount determined by the amount of the incident light and stores the same. Description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes and transfer transistors share the transistors.

The photodiode (PD) in each digital pixel 200 is a pinned photodiode (PPD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode (PD) is pinned in the substrate to reduce mixing of the dark current into signals.

The transfer transistor TG1-Tr of the photoelectric conversion reading part 210 is connected between the photodiode PD1 and the floating diffusion FD1 and controlled by a control signal TG applied to the gate thereof through a control line. The transfer transistor TG1-Tr remains selected and in the conduction state during a transfer period PT in which the control signal TG is at the high (H) level, to transfer to the floating diffusion FD1 the charges (electrons) produced by the photoelectric conversion and then stored in the photodiode PD1. After the photodiode PD1 and the floating diffusion FD1 are reset to a predetermined reset potential, the transfer transistor TG1-Tr enters the non-conduction state with the control signal TG being set to the low (L) level and the photodiode PD1 enters a storing period PI. Under these circumstances, if the intensity of the incident light is very high (the amount of the incident light is very large), the charges above the amount of saturated charges overflow into the floating diffusion FD1 as overflow charges through the overflow pass under the transfer transistor TG1-Tr. If the incident light has very high illuminance, for example, the charges above the amount of saturated charges at the floating diffusion FD1 overflow to the storage capacitor CS1 as overflow charges through the overflow pass under the storage transistor CG1-Tr.

The reset transistor RST1-Tr is connected between the power supply line Vdd of the power supply voltage VDD and the floating diffusion FD1 and controlled by a control signal RST applied to the gate thereof through a control line. The reset transistor RST1-Tr remains selected and in the conduction state during a reset period in which the control signal RST is at the H level, to reset the floating diffusion FD1 to the potential of the power supply line Vdd of the power supply voltage VDD.

The storage transistor CG1-Tr is connected between the floating diffusion FD1 and the reset transistor RST1-Tr, and the storage capacitor CS1 is connected between (i) the connection node ND3 between the floating diffusion FD1 and the reset transistor RST1-Tr and (ii) the reference potential VSS. The storage transistor CG1-Tr is controlled by a control signal DCG applied to the gate thereof through a control line. The storage transistor CG1-Tr remains selected and in the conduction state during a reset period in which the control signal DCG is at the H level so as to connect the floating diffusion FD1 and the storage capacitor CS1. Here, the solid-state imaging device 10 may be also configured such that the reading part 60 may selectively connect (couple) the floating diffusion FD1 serving as an output node and the storage capacitor CS1 depending on the illuminance of the signal.

The source follower transistor SF1-Tr serving as a source follower element is connected at the source thereof to the reading node ND2, at the drain thereof to the power supply line Vdd, and at the gate thereof to the floating diffusion FD1. The drain and source of the current transistor IC1-Tr serving as a current source element are connected between the reading node ND2 and the reference potential VSS (for example, GND). The gate of the current transistor IC1-Tr is connected to the feeding line of a control signal VBNPIX. The signal line LSGN1 between the reading node ND2 and the input part of the AD converting part 220 is driven by the current transistor IC1-Tr serving as a current source element.

Figure 4A:
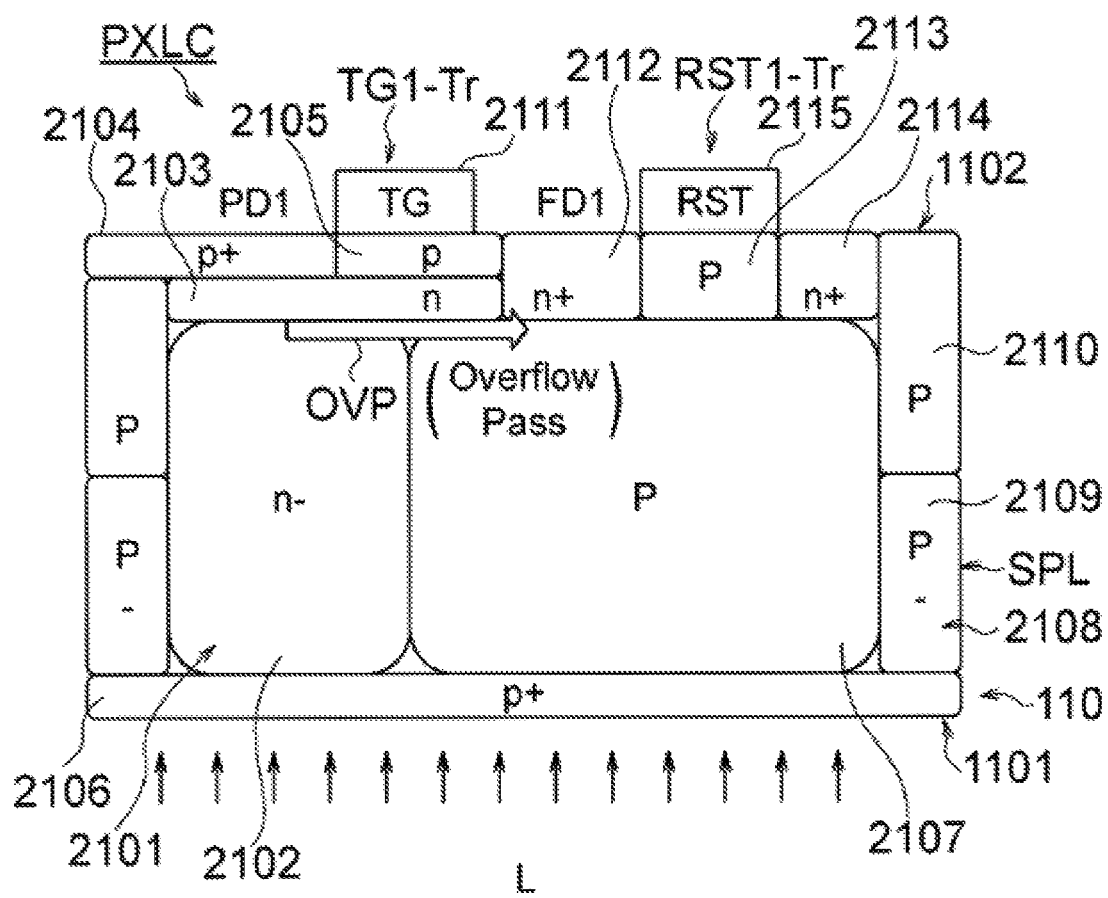
FIG. 4A is a simplified sectional view showing an example configuration of a charge storing and transferring system or the main part of the digital pixel relating to the first embodiment of the present invention.
Figure 4B:
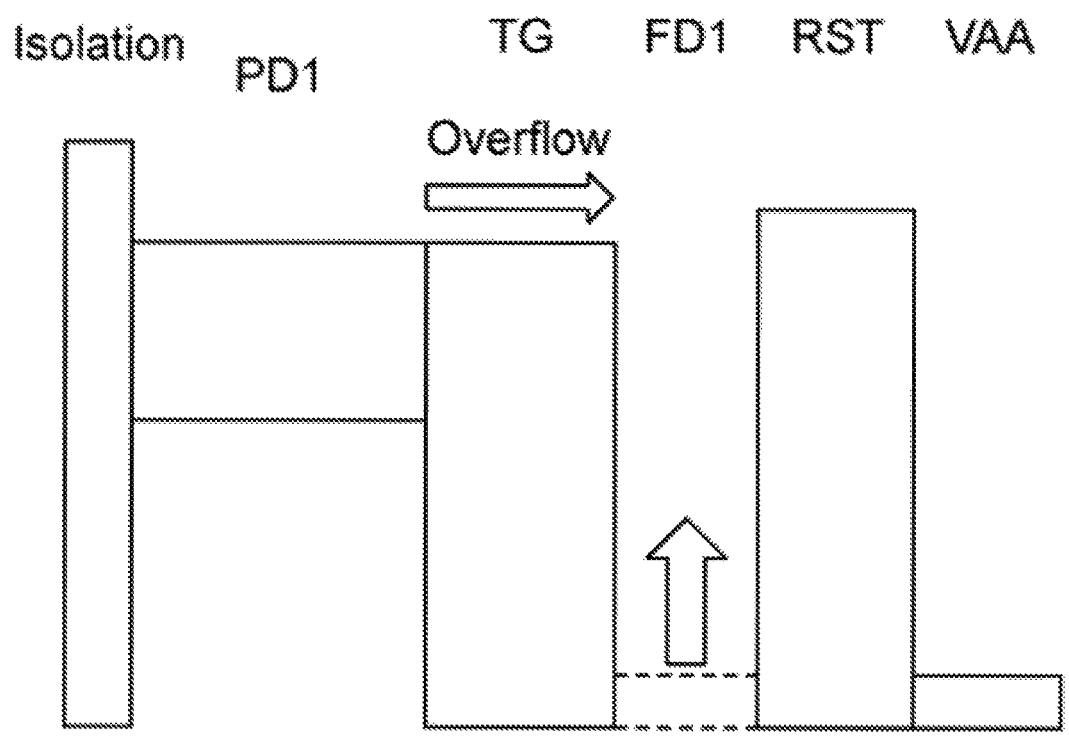
FIG. 4B is a potential diagram showing what happens during an overflow.
Figure 5A:
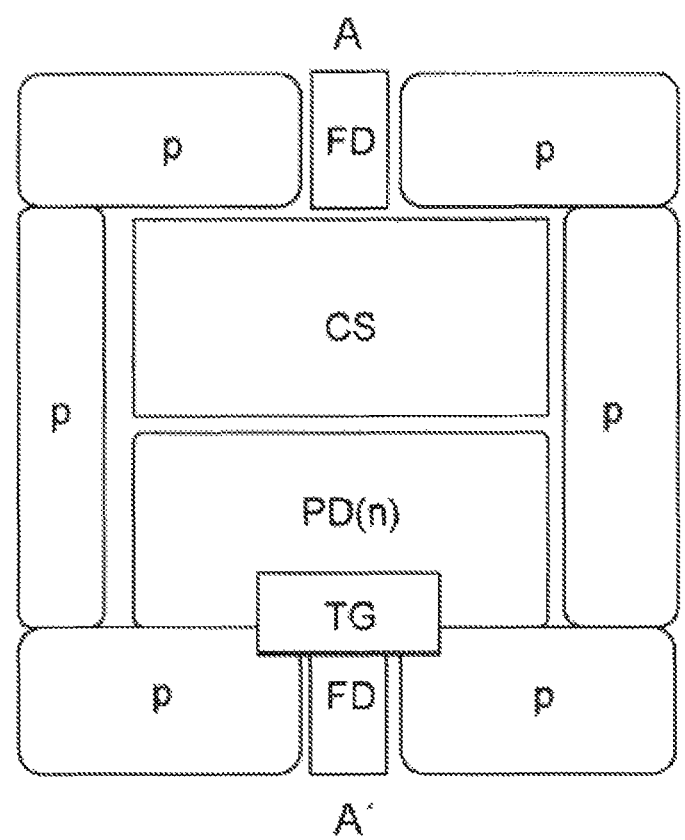
FIG. 5A is a simplified top view showing an example configuration of a charge storing and transferring system including a storage capacitor, which is the main part of the digital pixel relating to the first embodiment of the present invention.
Figure 5B:
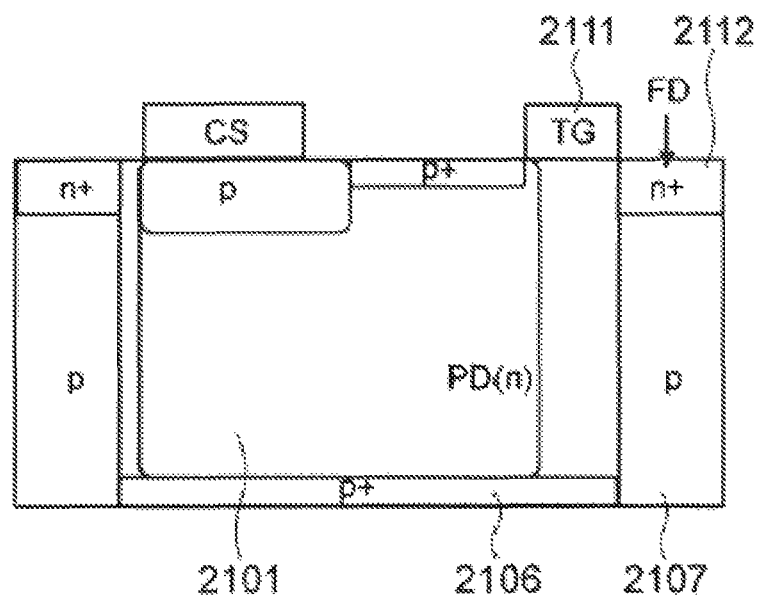
FIG. 5B is a simplified sectional view showing an example configuration of the charge storing and transferring system including a storage capacitor, which is the main part of the digital pixel relating to the first embodiment of the present invention.

FIG. 4A is a simplified sectional view showing an example configuration of a charge storing and transferring system or the main part of the digital pixel relating to the first embodiment of the present invention, and FIG. 4B is a potential diagram showing what happens during an overflow. FIGS. 4A and 4B show a basic charge storing and transferring system from the photodiode PD1 to the floating diffusion FD1 and do not show the storage transistor CG1-Tr and the storage capacitor CS1 constituting the charge storing part 212 for the sake of simplicity. FIGS. 5A and 5B are respectively a simplified top view and a simplified sectional view showing an example configuration of the charge storing and transferring system including a storage capacitor, which is the main part of the digital pixel relating to the first embodiment of the present invention.

Each digital pixel cell PXLC is formed on a substrate (in the present example, the first substrate 110) having a first substrate surface 1101 (for example, back surface) irradiated with light L and a second substrate surface 1102 that opposes the first substrate surface 1101 and defined by a separation layer SPL. The digital pixel cell PLXC shown in FIG. 4A includes the photodiode PD1, the transfer transistor TG1-Tr, the floating diffusion FD1 and the reset transistor RST1-T, which together form the photoelectric conversion reading part 210, the separation layer SPL, and a color filter part and a microlens, which are not shown.

<Configuration of Photodiode>

The photodiode PD1 includes a semiconductor layer of a first conductivity type (in the present embodiment, the n type) (in the present embodiment, the n layer) 2101 that is embedded in the semiconductor substrate having the first substrate surface 1101 and the second substrate surface 1102 opposing the first substrate surface 1101, and is capable of photoelectrically convert the received light and storing charges. On the lateral portion of the photodiode PD1 that is positioned at the end in the direction orthogonal to the normal to the substrate (the X direction of the orthogonal coordinate system in FIG. 4A), a separation layer SPL of a second conductivity type (in the present embodiment, the p type) is formed.

As described above, in the present embodiment, each digital pixel cell PXLC uses a pinned photodiode (PPD) as the photodiode (PD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode (PD) is buried in the substrate to reduce mixing of the dark current into signals.

In the photodiode PD1 shown in FIG. 4A, the n layer (the first-conductivity-type semiconductor layer) 2101 has a two-layer structure in the normal direction to the substrate 110 (the Z direction in the orthogonal coordinate system shown in FIG. 4A). In the present example, an n− layer 2102 is the closest to the first substrate surface 1101 and an n layer 2103 is closer to the second substrate surface 1102 than the n− layer 2102 is, and a p+ layer 2104 and a p layer 2105 are further formed and positioned closer to the second substrate surface 1102 than then layer 2103 is. Furthermore, a p+ layer 2106 is formed and positioned closer to the first substrate surface 1101 than the n− layer 2102 is. The p+ layer 2106 is formed without a gap and covers not only the photodiode PD1 but also the separation layer SPL and further other digital pixel cells PXLC.

A color filter part is formed on the light incidence surface of the P+ layer 2106, and a microlens is further formed on the light incidence surface of the color filter part in a portion corresponding to the photodiode PD1 and a portion of the separation layer SPL.

The above-described configurations are shown only as examples. A single-layer structure may be employed, or a stacked structure made up by three, four or more layers may be alternatively applied.

<Configuration of Separation Layer in X Direction (Column Direction)>

When the p-type separation layer SPL is seen in the X direction (the column direction) in FIG. 4A, a first p layer (a second-conductive-type semiconductor layer) 2107 is formed on the right lateral portion of the n− layer 2102 of the photodiode PD1 in the direction orthogonal to the normal to the substrate (the X direction in the orthogonal coordinate system shown in FIG. 4A). In the p-type separation layer SPL, on the right side of the first p layer 2107 in the X direction, a second p layer (a second-conductivity-type semiconductor layer) 2108 is formed and has a two-layer structure in the normal direction to the substrate 110 (the Z direction in the orthogonal coordinate system shown in FIG. 4A). In the present example, in the second p layer 2108, a p− layer 2109 is closer to the first substrate surface 1101 and a p layer 2110 is closer to the second substrate surface 1102 than the p− layer 2109 is.

The above-described configurations are shown only as examples. A single-layer structure may be employed, or a stacked structure made up by three, four or more layers may be alternatively applied.

Similarly to the photodiode PD1, the p+ layer 2106 is formed on the first p layer 2107 and the second p− layer 2109 of the p-type separation layer SPL on the first substrate surface 1101 side thereof.

An n layer 2103 is formed such that overflow pass OVP partly covers the surface of the first p layer 2107 of the p-type separation layer SPL that faces the second substrate surface 1102. On a p layer 2105 that is formed on the surface of the n layer 2103 that faces the second substrate surface 1102, a gate electrode 2111 of the transfer transistor TG1-Tr is formed with a gate insulator sandwiched therebetween. On the surface of the first p layer 2107 in the p-type separation layer SPL facing the second substrate surface 1102, an n+ layer 2112 is formed, which is to be formed into the floating diffusion FD1, a p layer 2113 is formed adjacent to the n+ layer 2112 which is to be formed into the channel formation region of the reset transistor RST1-Tr, and an n+ layer 2114 is formed adjacent to the p layer 2113. On the p layer 2113, a gate electrode 2115 is formed with a gate insulator sandwiched therebetween.

With the above-described structure, if the intensity of the incident light is very high (the amount of the incident light is very large), the charges above the amount of saturated charges overflow into the floating diffusion FD1 as overflow charges through the overflow pass OVP under the transfer transistor TG1-Tr.

The AD converting part 220 of the digital pixel 200 compares the analog voltage signal VSL output from the photoelectric conversion reading part 210 against the referential voltage VREF, which has a ramp waveform varying with a predetermined gradient or a fixed voltage level, to convert the analog signal into a digital signal.

As shown in FIG. 3, the AD converting part 220 includes a comparator (COMP) 221, a counter (CNT) 222, an input-side coupling capacitor C221, an output-side load capacitor C222, and a reset switch SW-RST.

In the comparator 221, a first input terminal or inversion input terminal (−) receives a voltage signal VSL fed thereto, which is output from the output buffer part 211 of the photoelectric conversion reading part 210 to the signal line LSGN1, a second input terminal or non-inversion input terminal (+) receives the referential voltage VREF fed thereto. The comparator 221 performs a comparing operation of comparing the voltage signal VST against the referential voltage VREF and outputting a digital comparison result signal SCMP.

The first input terminal or inversion input terminal (−) of the comparator 211 is connected to a coupling capacitor C221. In this way, the output buffer part 221 of the photoelectric conversion reading part 210 formed on the first substrate 110 is AC coupled to the input part of the comparator 221 of the AD converting part 220 formed on the second substrate 120, so that the noise can be reduced and high SNR can be achieved when the illuminance is low.

As for the comparator 221, the reset switch SW-RST is connected between the output terminal and the first input terminal or inversion input terminal (−), and the load capacitor C222 is connected between the output terminal and the reference potential VSS.

In the AD converting part 220, basically, the comparator 221 compares the analog signal (the potential VSL) read from the output buffer part 211 of the photoelectric conversion reading part 210 to the signal line LSGN1 against the referential voltage VREF, for example, the ramp signal RAMP that linearly changes with a certain gradient or has a slope waveform. During the comparison, the counter 222, which is provided for each column, is operating. The ramp signal RAMP having a ramp waveform and the value of the counter vary in a one-to-one correspondence, so that the voltage signal VSL is converted into a digital signal. Basically, the AD converting part 220 converts a change in voltage, in other words, a change in the referential voltage VREF (for example, the ramp signal RAMP) into a change in time, and converts the change in time into a digital value by counting the change in time at certain intervals (with certain clocks). When the analog signal VSL and the ramp signal RAMP (the referential voltage VREF) cross each other, the output from the comparator 221 is inverted and the clock input into the counter 222 is stopped, or the suspended clock is input into the counter 222 and the value (data) of the counter 222 at that timing is saved in the memory part 230. In this way, the AD conversion is completed. After the end of the above-described AD converting period, the data (signal) stored in the memory part 230 of each digital pixel 200 is output through the output circuit 40 to a signal processing circuit (not shown) and subject to predetermined signal processing, so that a two-dimensional image is produced.

<Basic First and Second Comparing Operations and Third Comparing Operation by Comparator 221>

The comparator 221 of the AD converting part 220 of the first embodiment is driven and controlled by the reading part 60 to perform first and second comparing operations and a third comparing operation during a pixel signal reading period.

When performing the first comparing operation CMPR1, under the control of the reading part 60, the comparator 221 outputs a digital first comparison result signal SCMP1 obtained by processing a voltage signal VSL1 corresponding to the overflow charges overflowing from the photodiode PD1, which is a photoelectric conversion element, to the floating diffusion FD1, which is an output node, in the storing period PI. The first comparing operation CMPR1 may be referred to as a TS mode or time stamp ADC mode operation.

When performing the second comparing operation CMPR2, under the control of the reading part 60, the comparator 221 outputs a digital second comparison result signal SCMP2 obtained by processing a voltage signal VSL2 (VSIG) corresponding to the charges stored in the photodiode PD1 that are transferred to the floating diffusion FD1, which is an output node, in the transfer period PT following the storing period PI. In the second comparing operation CMPR2, actually, before the voltage signal VSL2 (VSIG) corresponding to the stored charges is converted into a digital signal, a voltage signal VSL2 (VRST) corresponding to the reset voltage in the floating diffusion FD1 at the time of resetting is converted into a digital signal. The second comparing operation CMPR2 may be referred to as an HCG mode or linear ADC mode operation.

In a third comparing operation period PCMP3, a digital third comparison result signal SCMP3 is output, which is obtained by processing a voltage signal VSL3 (VSIG) corresponding to the sum of (adding together) the charges stored in the charge storing part 212 and the charges stored in the photodiode PD1 that are transferred to the floating diffusion FD1 serving as an output node in the transfer period PT following the storing period PI. In the third comparing operation CMPR3, actually, after the voltage signal VSL3 (VSIG) corresponding to the stored charges is converted into a digital signal, a voltage signal VSL3 (VRST) corresponding to the reset voltage in the floating diffusion FD1 at the time of resetting is converted into a digital signal. The third comparing operation CMPR3 may be referred to as an LCG mode or linear ADC mode operation.

In the present embodiment, the storing period PI basically denotes the period from when the photodiode PD1 and the floating diffusion FD1 are reset to the reset level to when the transfer transistor TG1-Tr is switched to the conduction state and the transfer period PT starts. The period PCMPR1 for the first comparing operation CMPR1 denotes the period from when the photodiode PD1 and the floating diffusion FD1 are reset to the reset level to when the first comparing operation CMPR1 ends before the transfer period PT starts. The period PCMPR2 for the second comparing operation CMPR2 denotes the period including the period after the transfer period PT, in which the reset level is sampled at the comparator 221 after the storing period PI ends. The period PCMPR3 for the third comparing operation CMPR3 denotes the period in which the stored charges are sampled at the comparator 221 as the referential voltage and the reset level is subsequently sampled.

Figure 6:
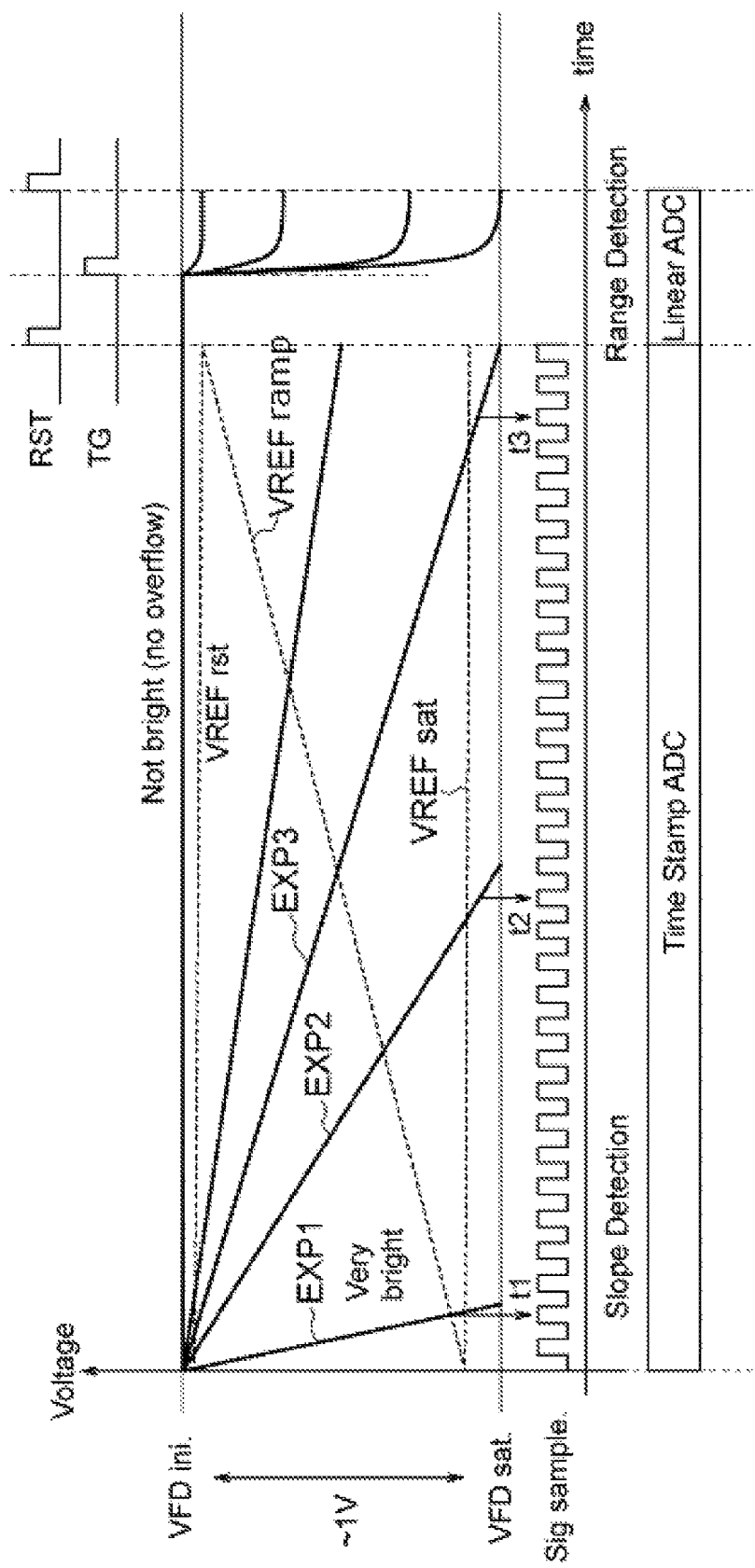
FIG. 6 is used to illustrate a first comparing operation performed by a comparator relating to the first embodiment of the present invention.

The following describes in more detail the first comparing operation CMPR1. FIG. 6 is used to illustrate the first comparing operation CMPR1 performed by the comparator 221 relating to the first embodiment of the present invention. In FIG. 6, the horizontal axis represents the time and the vertical axis represents the voltage level VFD of the floating diffusion FD1, which is an output node.

As for the voltage level VFD of the floating diffusion FD1, the smallest amount of charges and the highest voltage level VFDini can be observed when the floating diffusion FD1 is at the reset level. On the other hand, a large amount of charges and a low voltage level VFDsat are observed when the floating diffusion FD1 is saturated. Considering these, the referential voltage VREF1 for the comparator 221 is set to voltage VREFsat, which is a fixed level observed at the timing of non-saturation before the saturation is reached, or set to ramp voltage VREFramp, which varies from the voltage level VREFrst at the timing of resetting to the voltage level VREFsat.

If the referential voltage VREF1 is set to the level VREFsat or VREFramp during the first comparing operation CMPR1, the time required to flip (invert) the output of the comparator 221 decreases as the intensity of the incident light or illuminance increases as shown in FIG. 6. This is because the amount of charges increases as the intensity of the incident light or illuminance increases. In an example case EXP1 where the illuminance is of the highest level, the output of the comparator 221 is flipped (inverted) immediately at a timing t1 from a first level (for example, the Low level) to a second level (the High level). In an example case EXP2 where the illuminance is lower than in the example case EXP1, the output of the comparator 221 is flipped (inverted) at a timing t2 later than the timing t1 from the first level (for example, the Low level) to the second level (the High level). In an example case EXP3 where the illuminance is lower than in the example case EXP2, the output of the comparator 221 is flipped (inverted) at a timing t3 later than the timing t2 from the first level (for example, the Low level) to the second level (the High level).

As described above, as a result of the first comparing operation CMPR1, the comparator 221 outputs the first comparison result signal SCMP1 corresponding to the time determined by the amount of the overflow charges from the photodiode PD1 to the floating diffusion FD1 in a predetermined period of time within the storing period PI.

To be more specific, in the first comparing operation CMPR1, the comparator 221 is capable of comparing the light level against the referential voltage as long as the light level produces the signal level ranging (i) from the signal level corresponding to a predetermined threshold value of the photodiode PD1 obtained with a maximum value of the sampling time that is required to cause the overflow charges to start overflowing from the photodiode PD1 to the floating diffusion FD1, which is an output node, (ii) to the signal level obtained with a minimum value of the sampling time.

As described above, the photo conversion operation in the time stamp ADC mode involves light to time conversion in the storing period PI. As shown in FIG. 6, in the case of very bright light, the output of the comparator 221 is flipped from the first level (for example, the Low level) to the second level (the High level) immediately after the reset activation period, and this light level corresponds to a saturation signal (a well capacity) described as the following equation.

((FD Saturation Amount×Storing Time)/Sampling Period)+PD Saturation Amount

For example, a case is assumed where the FD saturation amount is 8 Ke—at 150 uV/e—(the FD capacitance of 1.1 fF) the minimum sampling time is 15 nsec, and the storing time is 3 msec.

This time stamp ADC operation mode (or the TS mode) is, as described above, capable of comparing the light level against the reference level as long as the light level produces the signal level ranging (i) from the signal level corresponding to a predetermined threshold value of the photodiode PD1 obtained with a maximum value of the sampling time that is required to cause the overflow charges to start overflowing from the photodiode PD1 to the floating diffusion FD1, which is an output node, (ii) to the signal level obtained with a minimum value of the sampling time.

Figure 7:
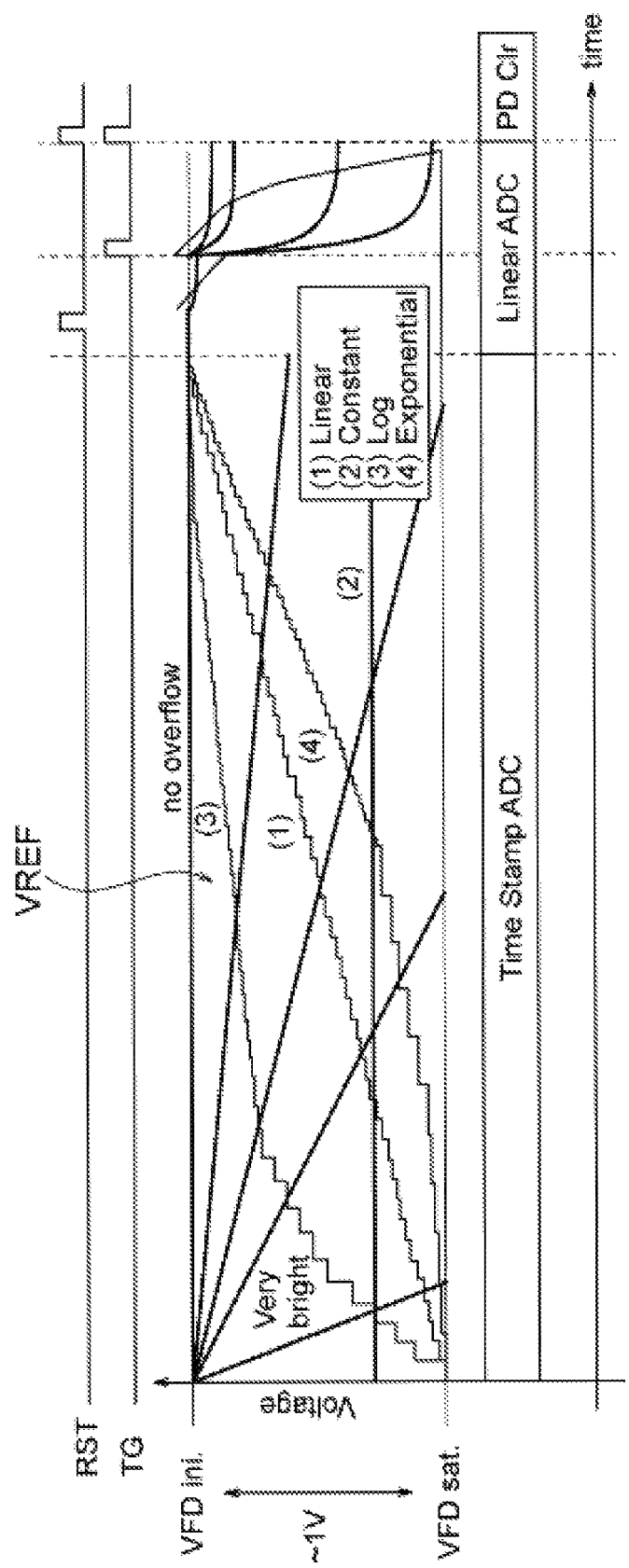
FIG. 7 is used to illustrate the first comparing operation performed by the comparator relating to the first embodiment and shows other examples of the pattern of a referential voltage.

FIG. 7 is used to illustrate the first comparing operation CMPR1 performed by the comparator 221 relating to the first embodiment and shows other examples of the pattern of the referential voltage.

The referential voltage VREF may be a voltage signal having a ramp waveform (signal) RAMP that varies with a predetermined gradient indicated by the number (1) in FIG. 7, a voltage signal having a fixed voltage DC indicated by the number (2) in FIG. 7, a log voltage signal indicated by the number (3) in FIG. 7 or an exponential voltage signal indicated by the number (4) in FIG. 7.

Figure 8:
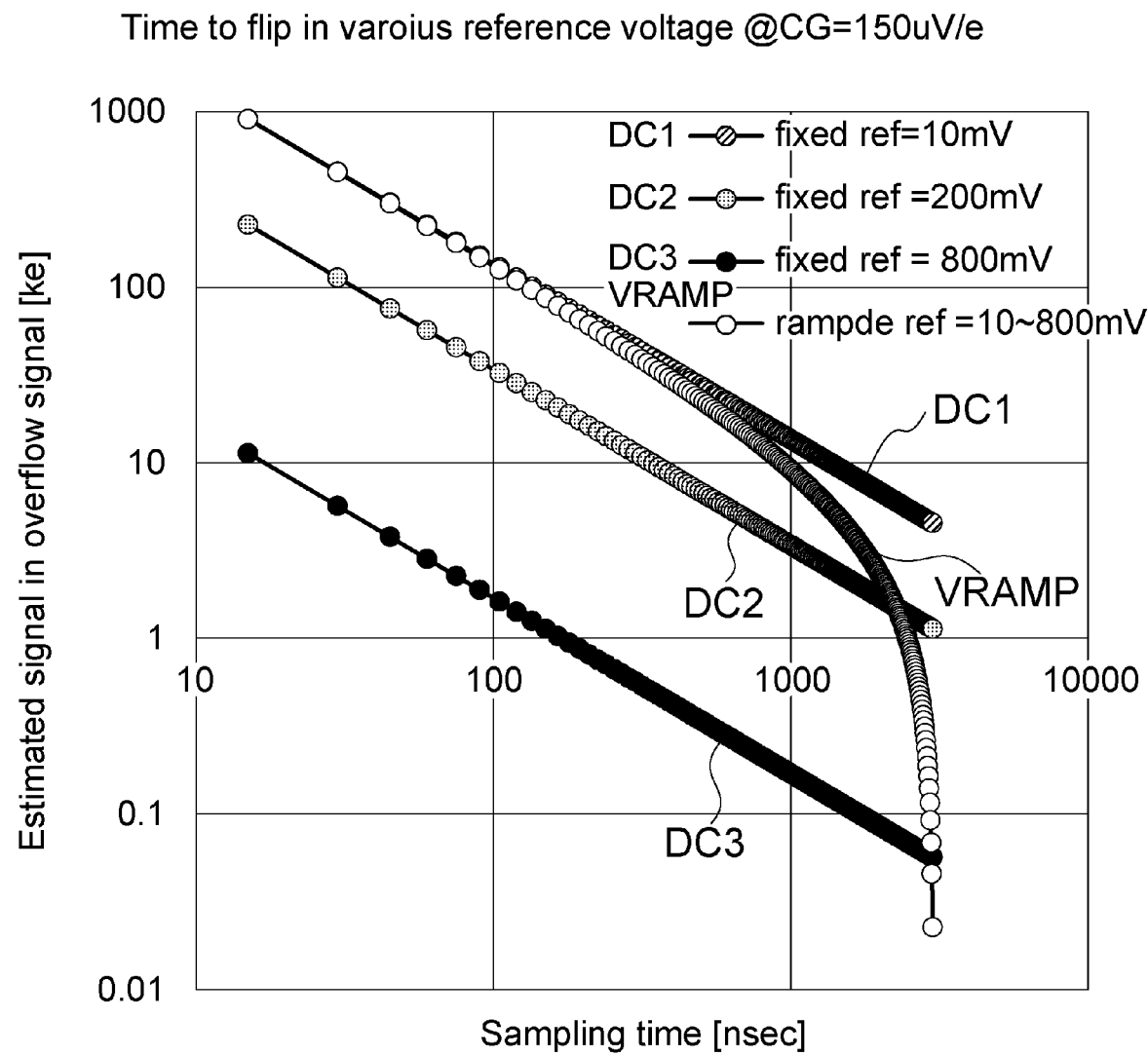
FIG. 8 shows the result of the light to time conversion when the referential voltage input into the comparator relating to the first embodiment is varied in level.

FIG. 8 shows the result of the light to time conversion when the referential voltage VREF input into the comparator relating to the first embodiment is varied in level. In FIG. 8, the horizontal axis represents the sampling time, and the vertical axis represents the estimated signal in the overflow signal. Here, the overflow signal means the estimated result under such a condition that the transfer transistor TG1-Tr is in the conduction state and the photodiode PD1 stores no charges (non-overflow).

FIG. 8 shows a sampling time required to flip the output of the comparator 221 corresponding to the overflow charges (signal) for different natures (properties) of the applied light. FIG. 8 shows the sampling time required to flip for various fixed reference voltage levels DC1, DC2, DC3 and a ramp reference voltage VRAMP. In this example, a linear reference ramp is used.

On completion of the above-described time stamp ADC mode (or TS mode) operation in which the first comparing operation CMPR1 for the saturated overflow charges is performed, the floating diffusion FD1 and the comparator 221 are reset, and the linear ADC mode (HCG mode) subsequently starts, in which the second comparing operation CMPR2 for the non-saturated charges is performed. Further later, the linear ADC mode (LCG mode) starts in which the third comparing operation CMPR3 for the saturated charges is performed.

Figure 9:
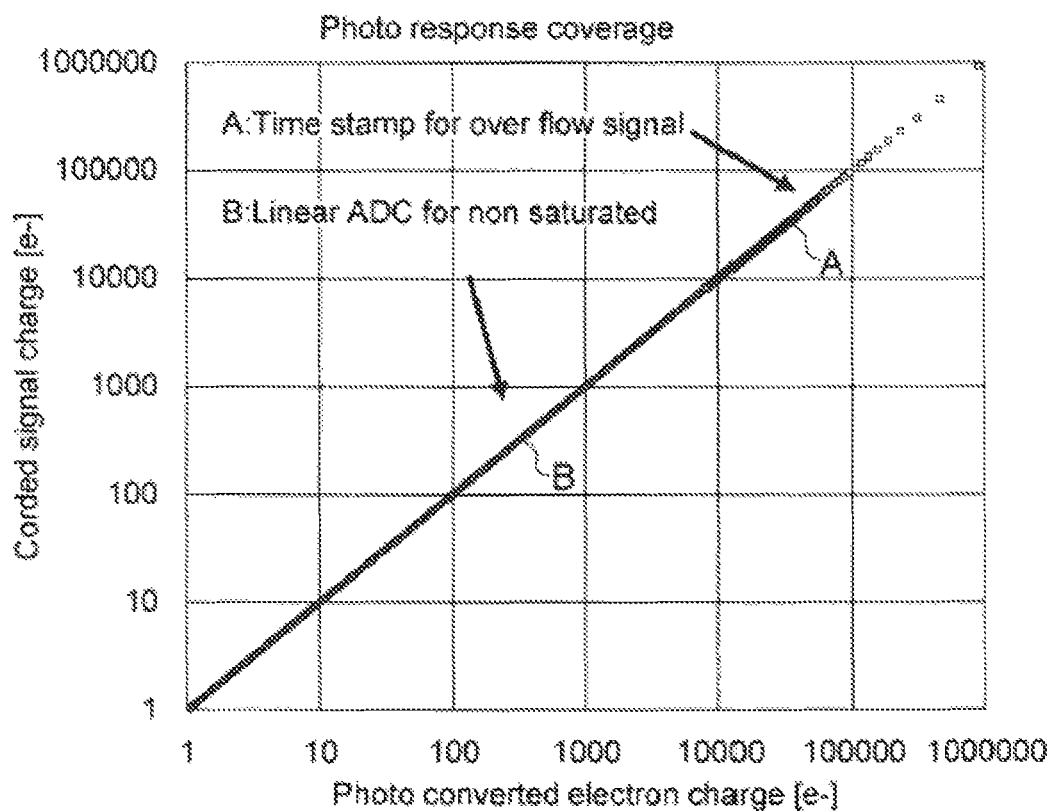
FIG. 9 shows photo response coverages relating to a first comparing operation and a second comparing operation performed in the digital pixel relating to the first embodiment of the present invention.
Figure 10:
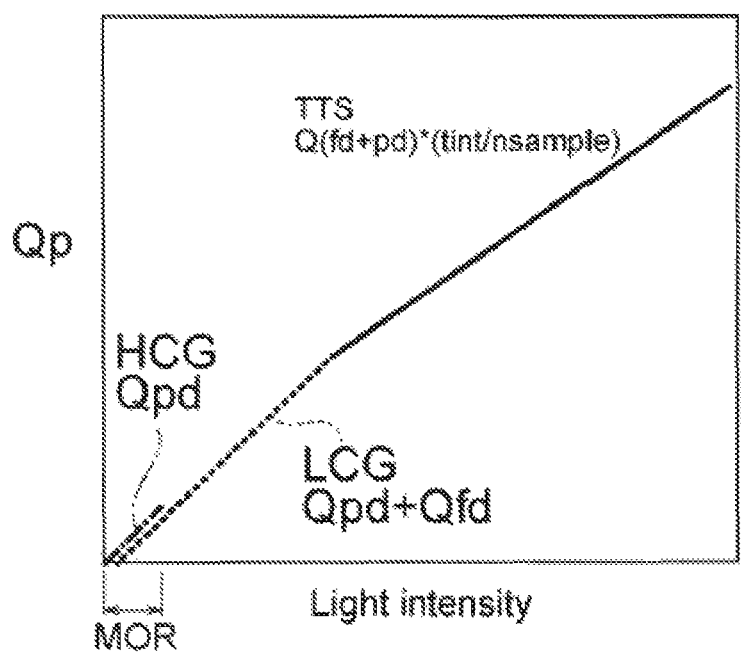
FIG. 10 shows photo response coverages relating to the first and second comparing operations and a third comparing operation performed in the digital pixel relating to the first embodiment of the present invention.
Figure 11A:
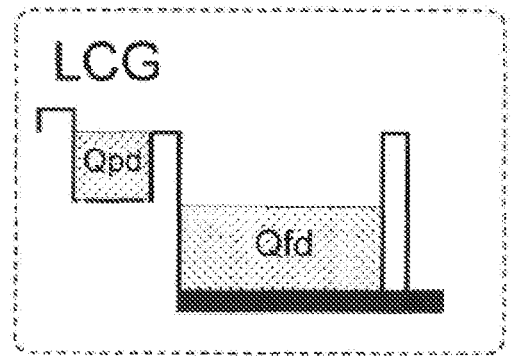
FIG. 11A is a potential diagram for signal charges in a case of LCG.
Figure 11B:
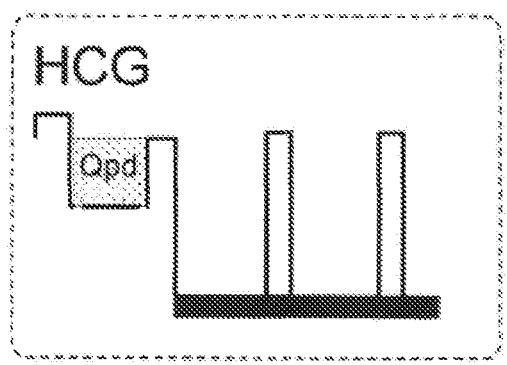
FIG. 11B is a potential diagram for signal charges in a case of HCG.

FIG. 9 shows the photo response coverage relating to the first comparing operation and the second comparing operation performed in the digital pixel relating to the first embodiment of the present invention. In FIG. 9, "A" represents the signal (AD conversion transfer curve) obtained in the time stamp ADC mode operation and "B" represents the signal (AD conversion transfer curve) obtained in the linear ADC mode (HCG mode). FIG. 10 shows the photo response coverage (photo conversion plot) relating to first and second comparing operations, and a third comparing operation performed in the digital pixel relating to the first embodiment of the present invention. In FIG. 10, "A" represents the signal (AD conversion transfer curve) obtained in the time stamp ADC mode operation, "B" represents the signal (AD conversion transfer curve) obtained in the linear ADC mode (HCG mode), and "C" represents the signal (AD conversion transfer curve) obtained in the linear ADC mode (LCG mode). In FIG. 10, the horizontal axis represents the light intensity, and the vertical axis represents the total amount Qp of the electrons obtained by photo conversion. FIGS. 11A and 11B are potential diagrams for signal charges in the cases of LCG and HCG.

In regard to the photo response coverages relating to the first and second comparing operations in the digital pixel, as shown in FIG. 9, the time stamp ADC mode (or TS mode) can provide photo response for very bright light, and the linear ADC mode can provide photo response for dark light. For example, a dynamic range of 120 dB can be realized. For example, the saturation signal within the photo conversion range has 900 Ke, as described above. Since the linear ADC mode involves a normal reading operation employing ADC, the linear ADC mode can cover the range from 2e or the noise level to 8 Ke where the photodiode PD1 and the floating diffusion FD1 are saturated. The coverage provided by the linear ADC mode can be increased to 30 Ke by adding a switch and a capacitor.

In this case, images can be obtained from light having a wide range of illuminance levels from low illuminance to high illuminance. In addition, the single-exposure dynamic range can be widened, global reading can be realized without pixel distortion, random access or ADC conversion in each pixel can be performed, and linearity can be reliably achieved in the high-illuminance region. In this case, however, the SN may disadvantageously get worse due to insufficient resolution of the digital signal.

On the other hand, in regard to the photo response coverages (photo conversion plots) relating to the first and second comparing operations performed in the digital pixel and the third comparing operation, as shown in FIG. 10, the signal (AD conversion transfer curve) obtained in the linear ADC mode (LCG mode) C exists between the signal (AD conversion transfer curve) A obtained in the time stamp ADC mode and the signal (AD conversion transfer curve) B obtained in the linear ADC mode (HCG mode). The signal (AD conversion transfer curve) B obtained in the linear ADC mode (HCG mode) and the signal (AD conversion transfer curve) C obtained in the linear ADC mode operation (LCG mode) overlap in the mode transition region MOR.

As a result, images can be obtained from light having a wide range of illuminance levels from low illuminance to high illuminance. In addition, the single-exposure dynamic range can be widened, global reading can be realized without pixel distortion, random access or ADC conversion in each pixel can be performed, and linearity can be reliably achieved in the high- and low-illuminance regions. In addition, it becomes possible to improve the lowered SN caused by the insufficient resolution in the digital signal.

The following further studies the photo response coverages (photo conversion plots) relating to the first and second comparing operations in the digital pixel and the third comparing operation.

Figure 12:
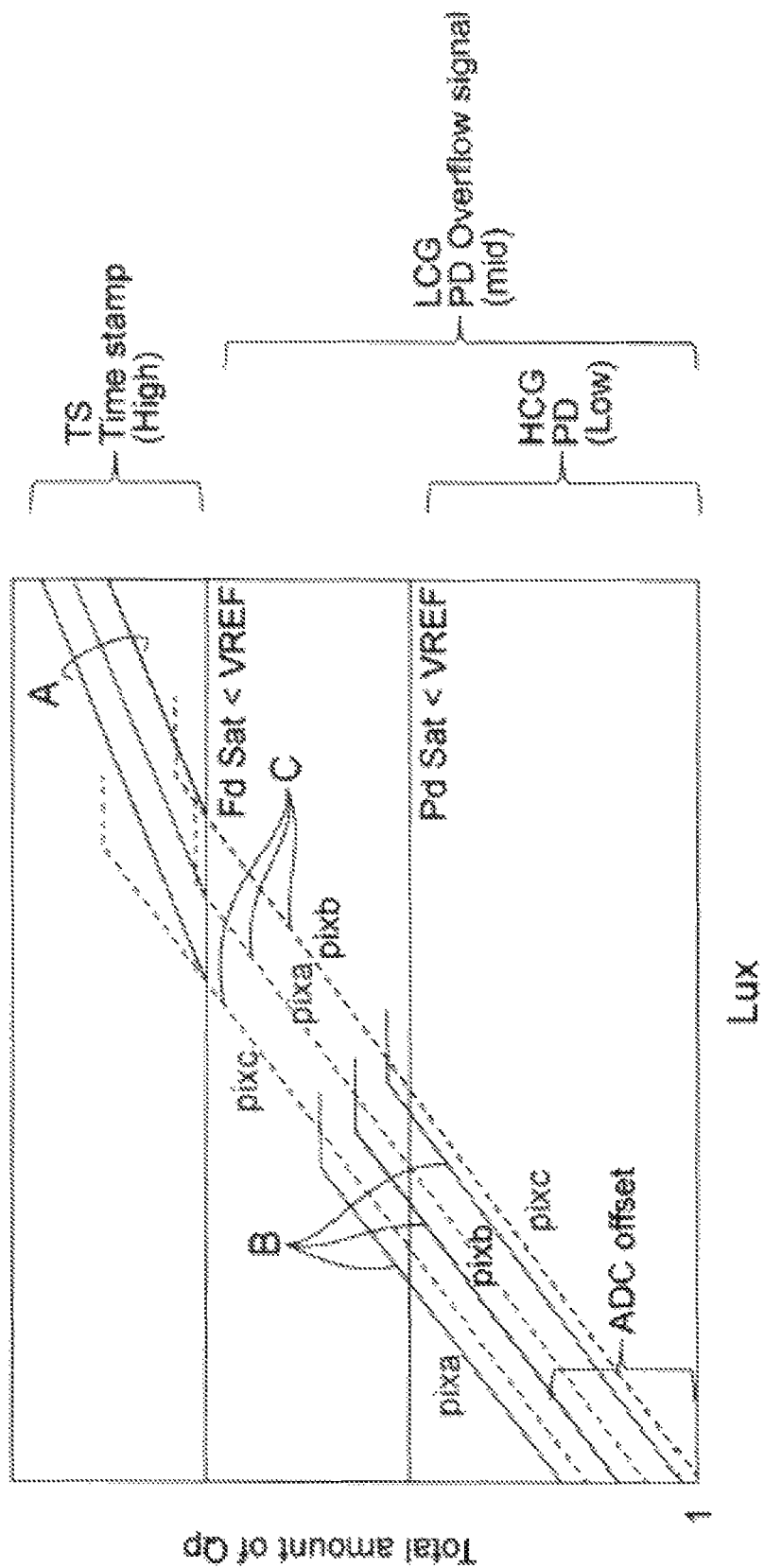
FIG. 12 shows the photo response coverages (photo conversion plots) relating to the first and second comparing operations and the third comparing operation performed in the digital pixel relating to the first embodiment of the present invention, and shows how the light intensity is related to the total amount Qp of the electrons obtained by the photo conversion.
Figure 13:
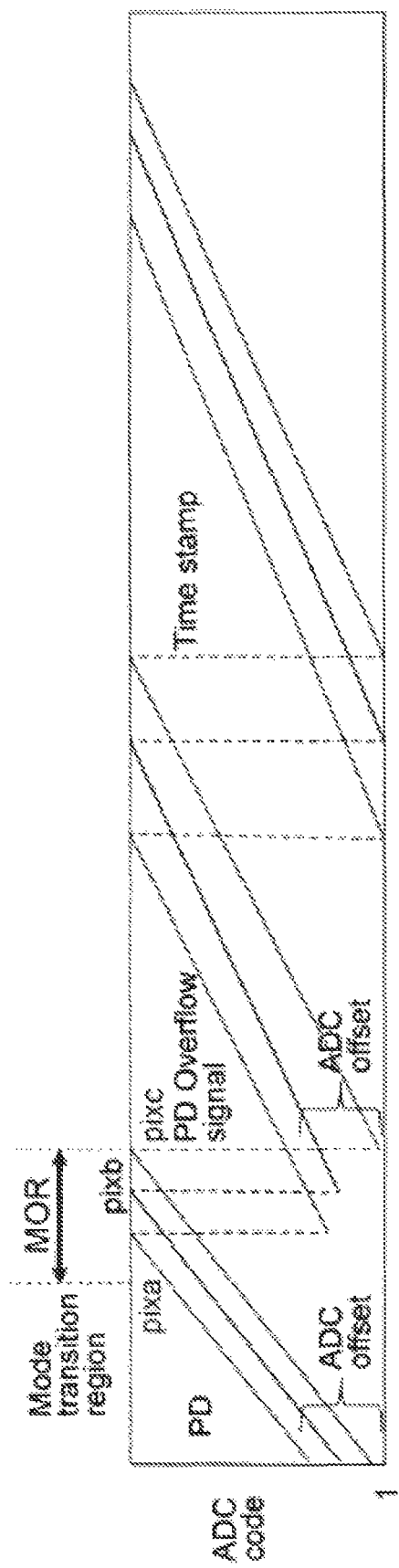
FIG. 13 shows the photo response coverages (photo conversion plots) relating to the first and second comparing operations and the third comparing operation performed in the digital pixel relating to the first embodiment of the present invention and shows how the light intensity is related to the ADC code.
Figure 14:
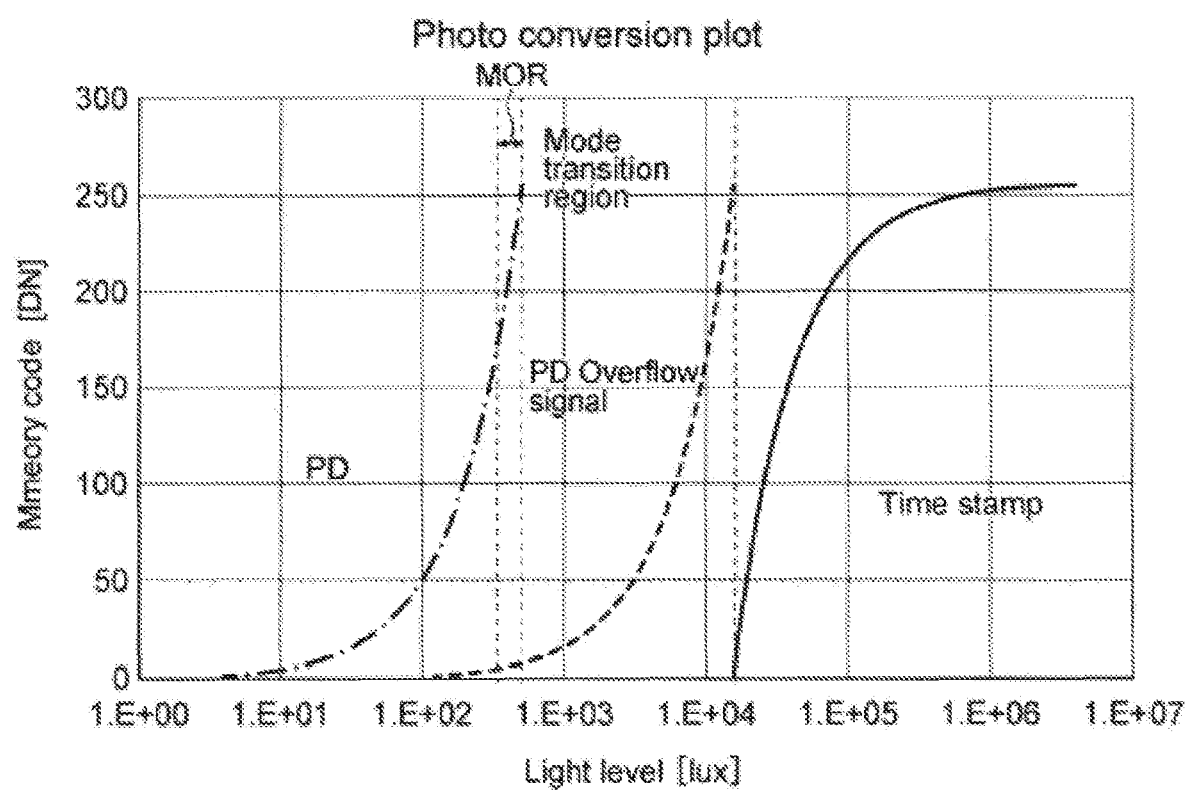
FIG. 14 shows the photo response coverages (photo conversion plots) relating to the first and second comparing operations and the third comparing operation performed in the digital pixel relating to the first embodiment of the present invention and shows how the light intensity is related to the memory code.
Figure 15:
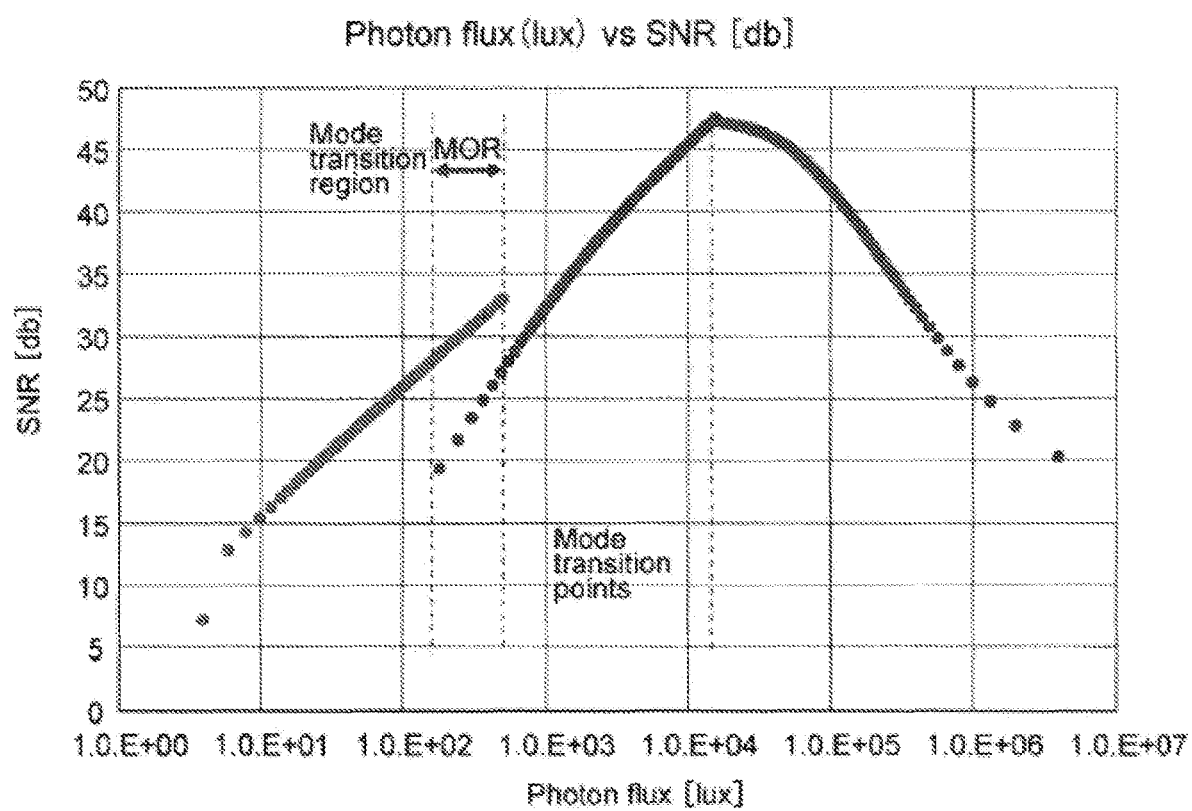
FIG. 15 shows the photo response coverages (photo conversion plots) relating to the first and second comparing operations and the third comparing operation performed in the digital pixel relating to the first embodiment of the present invention, and shows how the light intensity is related to the SNR.

FIG. 12 shows the photo response coverages (photo conversion plots) relating to the first and second comparing operations performed in the digital pixel relating to the first embodiment of the present invention and the third comparing operation, and shows how the light intensity is related to the total amount Qp of the electrons obtained by the photo conversion. FIG. 13 shows the photo response coverages (photo conversion plots) relating to the first and second comparing operations and the third comparing operation performed in the digital pixel relating to the first embodiment of the present invention and shows how the light intensity is related to the ADC code. FIG. 14 shows the photo response coverages (photo conversion plots) relating to the first and second comparing operations and the third comparing operation performed in the digital pixel relating to the first embodiment of the present invention and shows how the light intensity is related to the memory code. FIG. 15 shows the photo response coverages (photo conversion plots) relating to the first and second comparing operations and the third comparing operation performed in the digital pixel relating to the first embodiment of the present invention, and shows how the light intensity is related to the SNR.

As shown in FIGS. 12 to 15, in regard to the photo response coverages (photo conversion plots) relating to the first and second comparing operations in the digital pixel and the third comparing operation, the signal (AD conversion transfer curve) C obtained in the linear ADC mode (LCG mode) exists between the signal (AD conversion transfer curve) A obtained in the time stamp ADC mode and the signal (AD conversion transfer curve) B obtained in the linear ADC mode (HCG mode), as shown in FIG. 10. The signal (AD conversion transfer curve) B obtained in the linear ADC mode (HCG mode) and the signal (AD conversion transfer curve) C obtained in the linear ADC mode (LCG mode) overlap in the mode transition region MOR in the curves representing the relationship between the light intensity and any one of the total charge amount Qp, the ADC code, the memory code and the SNR. This means that the linearity can be reliably and favorably achieved in the low- and high-illuminance regions.

Figure 16:
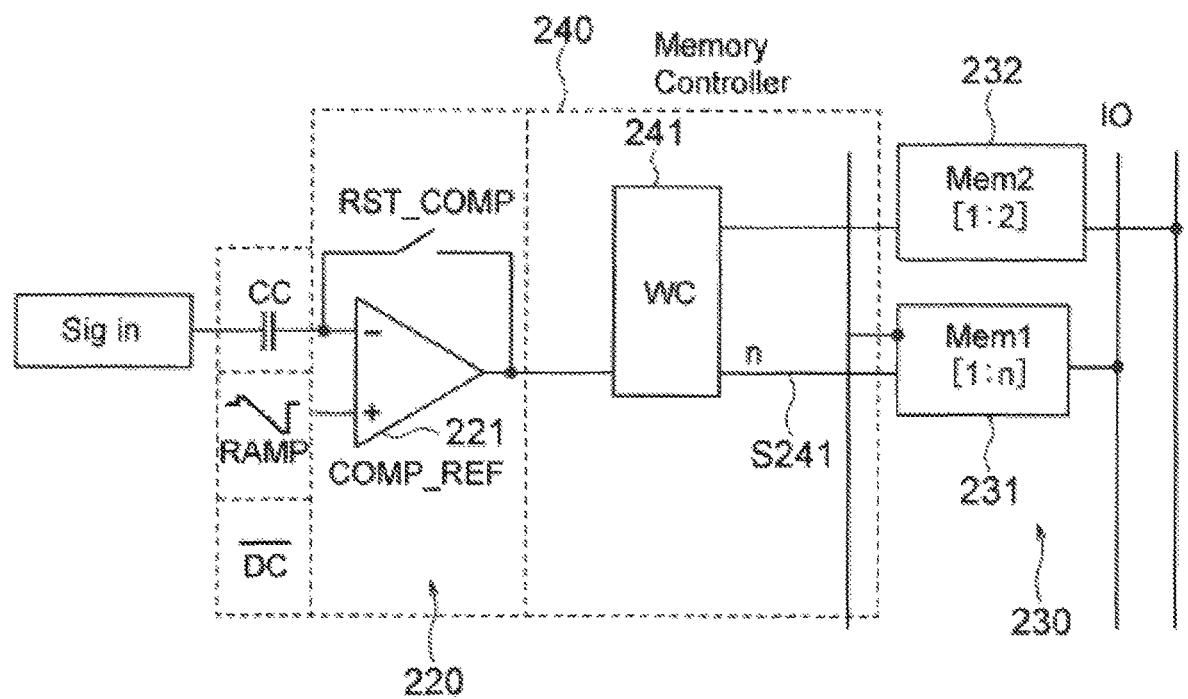
FIG. 16 is used to illustrate the configuration and function of a memory part and a memory control part relating to the first embodiment of the present invention.

FIG. 16 is used to illustrate the configuration and function of the memory part and the memory control part relating to the first embodiment of the present invention. The memory part 230 includes a first memory (Mem1) 231 and a second memory (Mem2) 232 as shown in FIGS. 3 and 12.

The first memory 231 saves, under the control of the memory control part 240, the first comparison result signal SCMP1, the second comparison result signal SCMP2 and the third comparison result signal SCMP3 from the comparator 221 in the form of n-bit digital data.

The second memory 232 saves, under the control of the memory control part 240, status information indicative of the operational mode. The second memory 232 saves, for example, status information of "0" for the HCG mode, status information "2" for the LCG mode, and status information "1" for the TS mode.

FIG. 17 shows, as an example, status information indicating the operational mode stored in the second memory 232 in association with various levels of light intensity in the first embodiment.

In the example shown in FIG. 17, the responsiveness is 100 Ke/lux, the amount of charges Qpd in the photodiode PD1 is 2 Ke, the amount of charges Qfd in the floating diffusion FD1 is 62 Ke, the storing time (Tint)/the sampling time (Tsample) is 400 µs/1.56 µs, and the bit depth of the first memory 231 is 8 bits.

In the HCG mode, where the status information "0" is saved in the second memory 232, the light level is low. In this case, the light intensity range [lux] is lower than −5 e2, the amount of charges Qpd in the photodiode PD1 is lower than 2 Ke, the amount of charges Qfd in the floating diffusion FD1 is zero, and the total maximum amount of charges Qmax is 2 Ke. The first memory 231 saves the second comparison result signal SCMP2 provided from the comparator 221 in the form of n-bit digital data corresponding to "0-255."

In the LCG mode, where the status information "2" is saved in the second memory 232, the light level is middle. In this case, the light intensity range [lux] is within the range of −5 e2 to 1.6 e4, the amount of charges Qpd in the photodiode PD1 is larger than 2 Ke, the amount of charges Qfd in the floating diffusion FD1 is smaller than 62 Ke, and the total maximum amount of charges Qmax is smaller than 62 Ke. The first memory 231 saves the third comparison result signal SCMP3 provided from the comparator 221 in the form of n-bit digital data corresponding to "0-255."

In the TS mode, where the status information "1" is saved in the second memory 232, the light level is high. In this case, the light intensity range [lux] is within the range of 1.6 e4 to 4 e6, the amount of charges Qpd in the photodiode PD1 is larger than 2 Ke, the amount of charges Qfd in the floating diffusion FD1 is smaller than 62 Ke, and the total maximum amount of charges Qmax is smaller than 15872 Ke. The first memory 231 saves the first comparison result signal SCMP1 provided from the comparator 221 in the form of n-bit digital data corresponding to "0-255."

The memory control part 240 includes a writing control part (write controller (WC)) 241 for the memory part 230. The writing control part 241 monitors whether the output from the comparator 221 is inverted to the level "1" or remains at the level "0" without being inverted, and allows the writing into the first memory 231 and the second memory 232 (write enable) unless the comparator 221 outputs the level "0." The memory control part 240 controls whether to allow the writing of the data corresponding to the second comparison result signal SCMP2 obtained as a result of the second comparing operation CMPR2 into the memory part 230, depending on the state of the first comparison result signal SCMP1 obtained as a result of the first comparing operation CMPR1. Furthermore, the memory control part 240 controls whether to allow the writing of the data corresponding to the third comparison result signal SCMP3 obtained as a result of the third comparing operation CMPR3 into the memory part 230, depending on the state of the first comparison result signal SCMP1 obtained as a result of the first comparing operation CMPR1 and the state of the second comparison result signal SCMP2 obtained as a result of the second comparing operation CMPR2.

Figure 18:
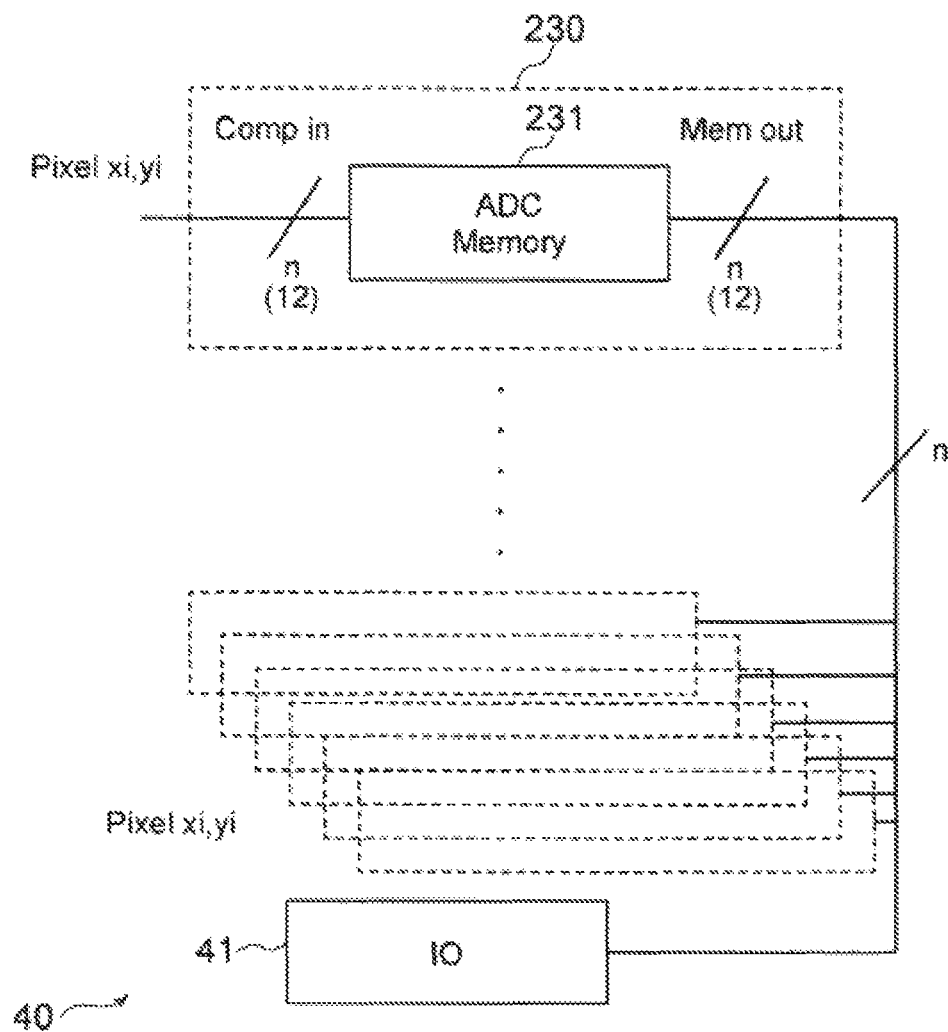
FIG. 18 shows an example configuration of a first memory and an output circuit of the memory part relating to the first embodiment of the present invention.

FIG. 18 shows an example configuration of the first memory and an output circuit of the memory part relating to the first embodiment of the present invention.

The n-bit memory 231 saves, in the form of digital data, the first comparison result signal SCMP1 that is obtained as a result of the first comparing operation CMPR1 in the comparator 221 by digitizing the voltage signal corresponding to the overflow charges in the floating diffusion FD1, the second comparison result signal SCMP2 obtained as a result of the second comparing operation CMPR2 by digitizing the charges stored in the photodiode PD1 and the third comparison result signal SCMP3 obtained as a result of the third comparing operation CMPR3 by digitizing the sum of the charges stored in the photodiode PD1 and the charges stored in the charge storing part 212, in a correlative manner.

In the memory part 230, the first memory 231, which is capable of sampling and holding n-bit data, is formed by SRAM, DRAM and the like, receives, for example, digitized signals fed thereto, is compatible with photo conversion codes, and can be read by an external IO buffer 41 in the output circuit 40 near the pixel array.

The memory control part 240 controls whether to allow memory access to the first memory 231, to be more specific, whether to allow writing (overwriting), using the output signal 5241 from the memory control part 240, depending on the state (in the present embodiment, the level) of the comparison result signal output from the comparator 221. If the signal 5241 corresponding to the first comparison result signal SCMP1 obtained as a result of the first comparing operation CMPR1 is fed at a first level (the Low level), the writing (overwriting) to the first memory 231 is prohibited. If the signal 5241 is fed at a second level (the High level), the writing (overwriting) is allowed.

The first memory 231 is controlled by the memory control part 240 as to whether writing of the data corresponding to the third comparison result signal obtained as a result of the third comparing operation into the first memory 231 is to be performed, depending on the state of the first comparison result signal obtained as a result of the first comparing operation and the state of the second comparison result signal obtained as a result of the second comparing operation. The memory control part 240 allows writing (overwriting) of the data corresponding to the third comparison result signal SCMP3 obtained as a result of the third comparing operation CMPR3 into the first memory 231 if the level of the second comparison result signal SCMP2 obtained as a result of the second comparing operation CMPR2 stays at and does not change from the second level (the High level) in the second comparing operation period PCMPR2.

<Sequence of Operations in Reading Mode Performed by Memory Control Part and Memory Part>

Figure 19:
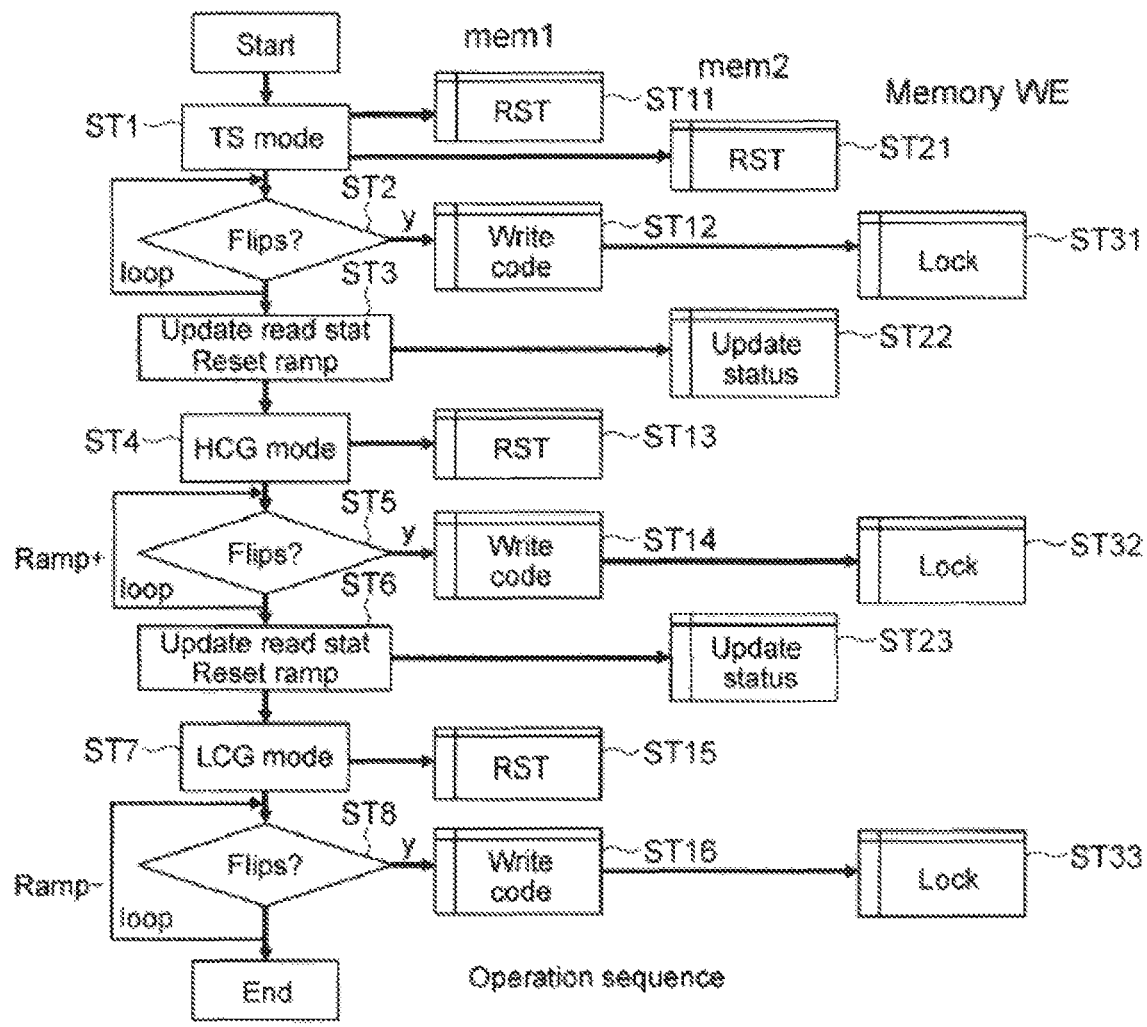
FIG. 19 is a flowchart illustrating a sequence of operations performed in a reading mode by the memory control part and the memory part of the solid-state imaging device relating to the first embodiment of the present invention.

FIG. 19 is a flowchart illustrating a sequence of operations performed in a reading mode by the memory control part and the memory part of the solid-state imaging device relating to the first embodiment of the present invention.

To begin with, the reading mode enters the TS mode (ST1) and the first comparing operation CMPR1 is performed. Accordingly, the first memory 231 and the second memory 232 are reset (ST11, ST21). The memory control part 240 judges whether the output from the comparator 221 as a result of the first comparing operation CMPR1 is flipped (inverted) from the first level (Low level) to the second level (High level) (ST2). If the step ST2 judges that the output from the comparator 221 is flipped, the first comparison result signal SCMP1 obtained in the first comparing operation CMPR1 by digitizing the voltage signal corresponding to the overflow charges in the floating diffusion FD1 is written into the first memory 231 in the form of an ADC code, which is a digital code (ST12). The writing allowed (write enable) signal is locked (ST31).

If the step ST2 judges that the output from the comparator 221 is not flipped, the reading mode is updated from the TS mode to the HCG mode, the reference voltage VREF having a ramp waveform is reset (ST3), and the status information in the second memory 232 is updated from "1" indicating the TS mode to "0" indicating the HCG mode (ST22).

After the reading mode transitions from the TS mode to the HCG mode (ST4) in the above manner, the second comparing operation CMPR2 is performed. This involves resetting the first memory 231 (ST13). The memory control part 240 judges whether the output from the comparator 221 as a result of the second comparing operation CMPR2 is flipped (inverted) from the first level (Low level) to the second level (High level) (ST5). If the step ST5 judges that the output from the comparator 221 is flipped, the second comparison result signal SCMP2 obtained as a result of the second comparing operation CMPR2 by digitizing the voltage signal corresponding to the charges stored in the photodiode PD1 is written into the first memory 231 in the form of an ADC code, which is digital data (ST14). The writing allowed (write enable) signal is locked (ST32).

If the step ST5 judges that the output from the comparator 221 is not flipped, the reading mode is updated from the HCG mode to the LCG mode, the reference voltage VREF having a ramp waveform is reset (ST6), and the status information in the second memory 232 is updated from "0" indicating the HCG mode to "2" indicating the LCG mode (ST23).

After the reading mode transitions from the HCG mode to the LCG mode (ST7) in the above manner, the third comparing operation CMPR3 is performed. This involves resetting the first memory 231 (ST15). The memory control part 240 judges whether the output from the comparator 221 as a result of the third comparing operation CMPR3 is flipped (inverted) from the second level (High level) to the first level (Low level) (ST8). If the step ST8 judges that the output from the comparator 221 is flipped, the third comparison result signal SCMP3 obtained as a result of the third comparing operation CMPR3 by digitizing the voltage signal corresponding to the sum of the charges stored in the photodiode PD1 and the charges stored in the charge storing part 212 is written into the first memory 231 in the form of an ADC code, which is digital data (ST16). The writing allowed (write enable) signal is locked (ST33).

Figure 20:
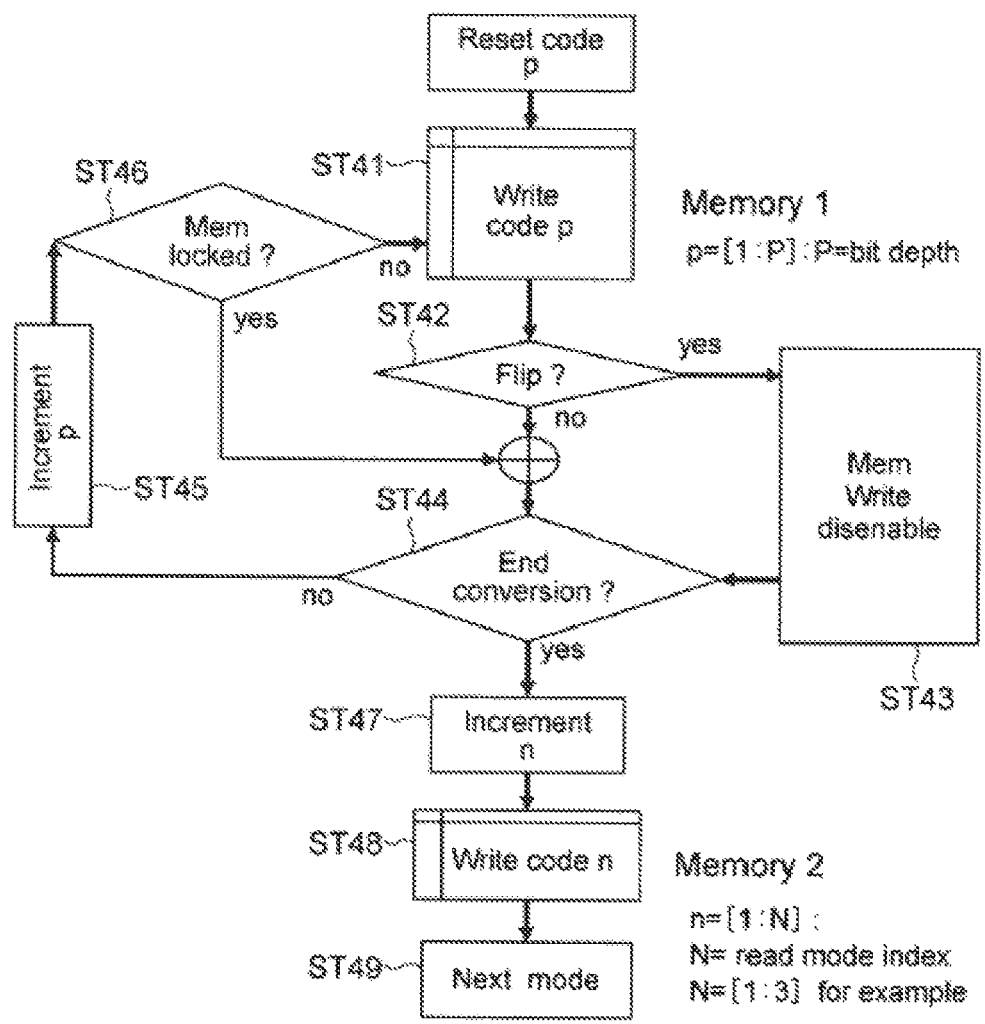
FIG. 20 is a flowchart illustrating a sequence of operations performed by the memory part of the solid-state imaging device relating to the first embodiment of the present invention.

FIG. 20 is a flowchart illustrating a sequence of operations performed by the memory part of the solid-state imaging device relating to the first embodiment of the present invention.

When an ADC code, which is digital data having a bit depth p, is to be written into the first memory 231 (ST41), it is judged in each mode whether the output from the comparator 221 is flipped or not (ST42). If the step ST42 judges that the output from the comparator 221 is flipped, the first memory 231 enters the write disable state (ST43). If the step ST42 judges that the output from the comparator 221 is not flipped, writing of the bit depth is performed provided that the memory is locked (ST44 to ST46). When the writing for n codes is completed (ST47, ST48), the operations in the next mode are subsequently performed.

<Frame Reading Sequence>

Figure 21:
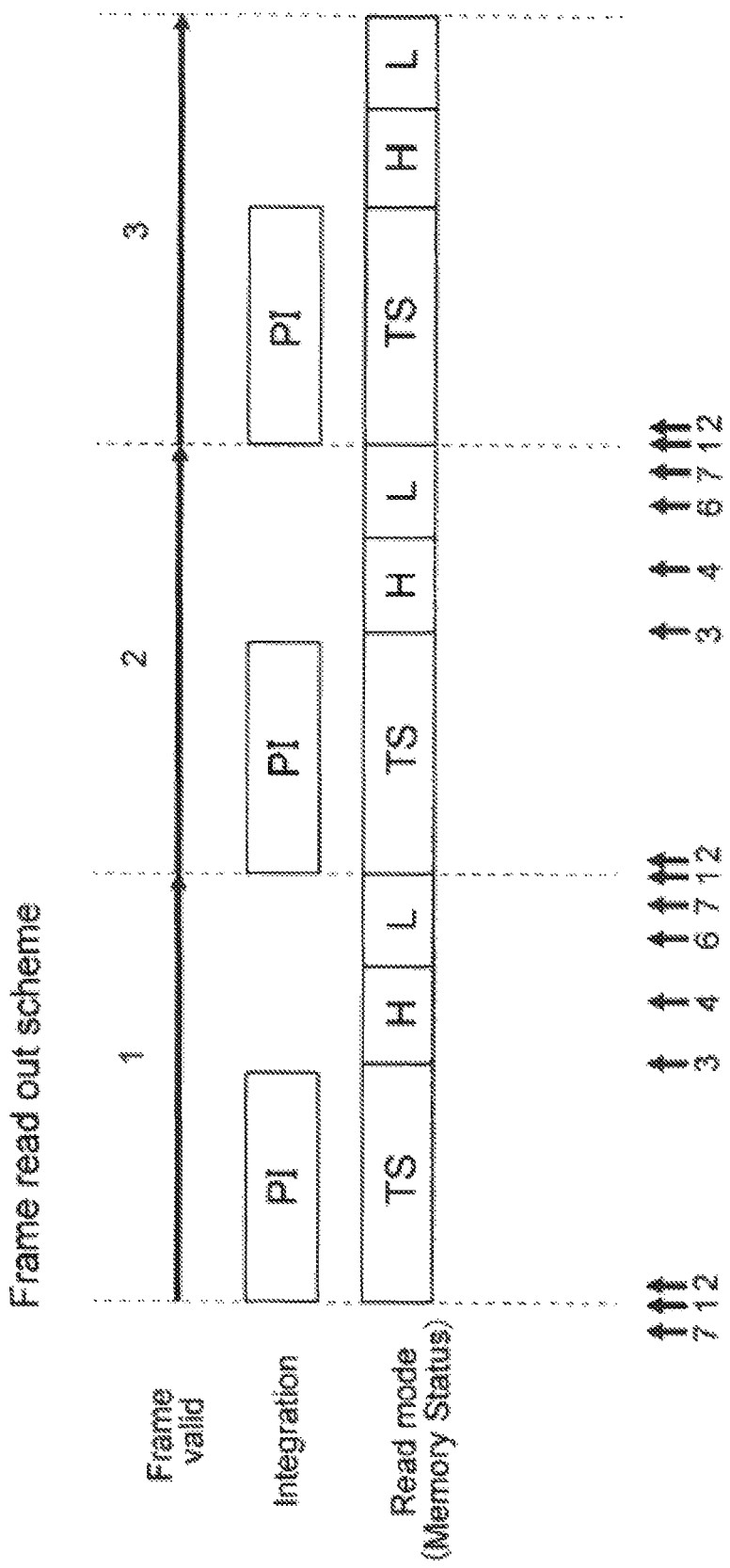
FIG. 21 shows an example sequence of operations performed in a frame reading operation by the solid-state imaging device relating to the first embodiment of the present invention.

FIG. 21 shows an example sequence of operations performed in a frame reading scheme by the solid-state imaging device 10 relating to the first embodiment of the present invention. The following first describes an example of the frame reading scheme in the solid-state imaging device 10. In FIG. 21, TS denotes the period in which the operations of the time stamp ADC or TS mode are performed, H denotes the period in which the operations of the HCG mode are performed, L denotes the period in which the operations of the LCG mode are performed.

As described above, the overflow charges are stored in the floating diffusion FD1 in the storing period PI. The solid-state imaging device 10 operates in the time stamp ADC mode or TS mode within the storing period PI. Actually, the solid-state imaging device 10 operates in the TS mode within a period that is included in the storing period PI and lasts until the floating diffusion FD1 is reset. On completion of the operations in the TS mode, the solid-state imaging device 10 transitions to the linear ADC mode (HCG mode), so that the signal (VRST) at the floating diffusion FD1 at the time of resetting is read and converted into a digital signal to be stored in the memory part 230. After the end of the storing period PI, in the linear ADC mode, the signal (VSIG) corresponding to the charges stored in the photodiode PD1 is read and converted into a digital signal to be stored into the memory part 230. To be more specific, in the first comparing operation period PCMPR1, the voltage signal VSL corresponding to the overflow charges overflowing from the photodiode PD1, which is a photoelectric conversion element, to the floating diffusion FD1, which is an output node, in the storing period PI is output.

In the second comparing operation period PCMP2, the voltage signal VSL corresponding to the charges stored in the photodiode PD1 that are transferred to the floating diffusion FD1 serving as an output node in the transfer period PT following the storing period PI is output. In the second comparing operation period PCMPR2, the read-out reset signal (signal voltage) (VRST) and the read-out signal (signal voltage) (VSIG) are output, as a pixel signal, to the AD converting part 220.

Furthermore, in the third comparing operation period PCMP3, the voltage signal VSL corresponding to the sum of (adding together) the charges stored in the photodiode PD1 that are transferred to the floating diffusion FD1 serving as an output node in the transfer period PT following the storing period PI and the charges stored in the storing part 2122 is output. In the third comparing operation period PCMPR3, the read-out reset signal (signal voltage) (VRST) and the read-out signal (signal voltage) (VSIG) are output, as a pixel signal, to the AD converting part 220.

The read frame is sent outside of the solid-state imaging device 10 (the image sensor) via the IO buffer 41 (FIG. 18) of the output circuit 40, which is driven by reading the digital signal data from the memory node and has such an MIPI data format. This operation can be globally performed in the pixel array.

In the pixel part 20, the reset transistor RST1-Tr and the transfer transistor TG1-Tr are used to reset the photodiode PD1 concurrently in all of the pixels, so that exposure to light starts concurrently in parallel in all of the pixels. After a predetermined exposure period (the storing period PI) ends, the transfer transistor TG1-Tr is used to sample the output signal from the photoelectric conversion reading part 210 in the AD converting part 220 and the memory part 230, so that the exposure ends concurrently in parallel in all of the pixels. This successfully accomplish a perfect electronic shutter.

<Configuration and Function of Memory Control Part 240>

The solid-state imaging device 10 relating to the present embodiment further includes the memory control part 240 for controlling access made to the memory part depending on the state (in the present embodiment, the level) of the comparison result signal from the comparator 221. The memory control part 240 controls whether to allow the writing of the data corresponding to the second comparison result signal SCMP2 obtained as a result of the second comparing operation CMPR2 into the memory part 230, depending on the state (the output level) of the first comparison result signal SCMP1 obtained as a result of the first comparing operation CMPR1. To be more specific, the memory control part 240 prohibits the writing of the data corresponding to the second comparison result signal SCMP2 obtained as a result of the second comparing operation CMPR2 into the memory part 230 if the level of the first comparison result signal SCMP1 obtained as a result of the first comparing operation CMPR1 changes from the first level (for example, Low level) to the second level (High level) in the first comparing operation period PCMPR1. On the other hand, the memory control part 240 allows the writing of the data corresponding to the second comparison result signal SCMP2 obtained as a result of the second comparing operation CMPR2 into the memory part 230 if the level of the first comparison result signal SCMP1 obtained as a result of the first comparing operation CMPR1 stays at and does not change from the first level (for example, Low level) in the first comparing operation period PCMPR1. Furthermore, the memory control part 240 controls whether to allow writing of the data corresponding to the third comparison result signal obtained as a result of the third comparing operation into the first memory 231, depending on the state of the first comparison result signal obtained as a result of the first comparing operation and the state of the second comparison result signal obtained as a result of the second comparing operation. The memory control part 240 allows the writing (overwriting) of the data corresponding to the third comparison result signal SCMP3 obtained as a result of the third comparing operation CMPR3 into the first memory 231 if the level of the second comparison result signal SCMP2 obtained as a result of the second comparing operation CMPR2 stays at and does not change from the second level (for example, High level) in the second comparing operation period PCMPR2.

The reason why the memory control part 240 is provided is described in the following. The fact that the level of the first comparison result signal SCMP1 obtained as a result of the first comparing operation CMPR1 changes from a first level (for example, the low level) to a second level (the High level) in the first comparing operation period PCMPR1 during the time stamp ADC mode means the following. The photodiode PD1 is irradiated with light having very (extremely) high illuminance (bright) and the charges obtained by the photoelectric conversion overflow from the photodiode PD1 to the floating diffusion FD1 as overflow charges. This indicates that the read-out signal in the subsequent linear ADC mode is not necessary. Considering this, the memory control part 240 prohibits the writing (overwriting) of the data corresponding to the second comparison result signal SCMP2 obtained as a result of the second comparing operation CMPR2 into the memory part 230.

On the other hand, the fact that the level of the first comparison result signal SCMP1 obtained as a result of the first comparing operation CMPR1 does not change from the first level (for example, Low level) to the second level (High level) in the first comparing operation period PCMPR1 during the time stamp ADC mode means the following. The photodiode PD1 is irradiated with dark light having normal or low to middle illuminance and there is a very low possibility that the charges obtained by the photoelectric conversion overflow from the photodiode PD1 to the floating diffusion FD1 as overflow charges. This indicates that the read-out signal in the subsequent linear ADC mode is necessary. Considering this, the memory control part 240 allows the writing (overwriting) of the data corresponding to the second comparison result signal SCMP2 obtained as a result of the second comparing operation CMPR2 into the memory part 230.

Likewise, the fact that the level of the second comparison result signal SCMP2 obtained as a result of the second comparing operation CMPR2 does not change from the first level (for example, Low level) to the second level (High level) in the second comparing operation period PCMPR2 during the linear ADC mode means the following. The photodiode PD1 is irradiated with dark light having low to middle illuminance and there is a low possibility that the charges obtained by the photoelectric conversion overflow from the photodiode PD1 to the floating diffusion FD1 as overflow charges. This indicates that the read-out signal in the subsequent LCG mode is necessary. Considering this, the memory control part 240 allows the writing (overwriting) of the data corresponding to the third comparison result signal SCMP3 obtained as a result of the third comparing operation CMPR3 into the memory part 230.

Figure 22:
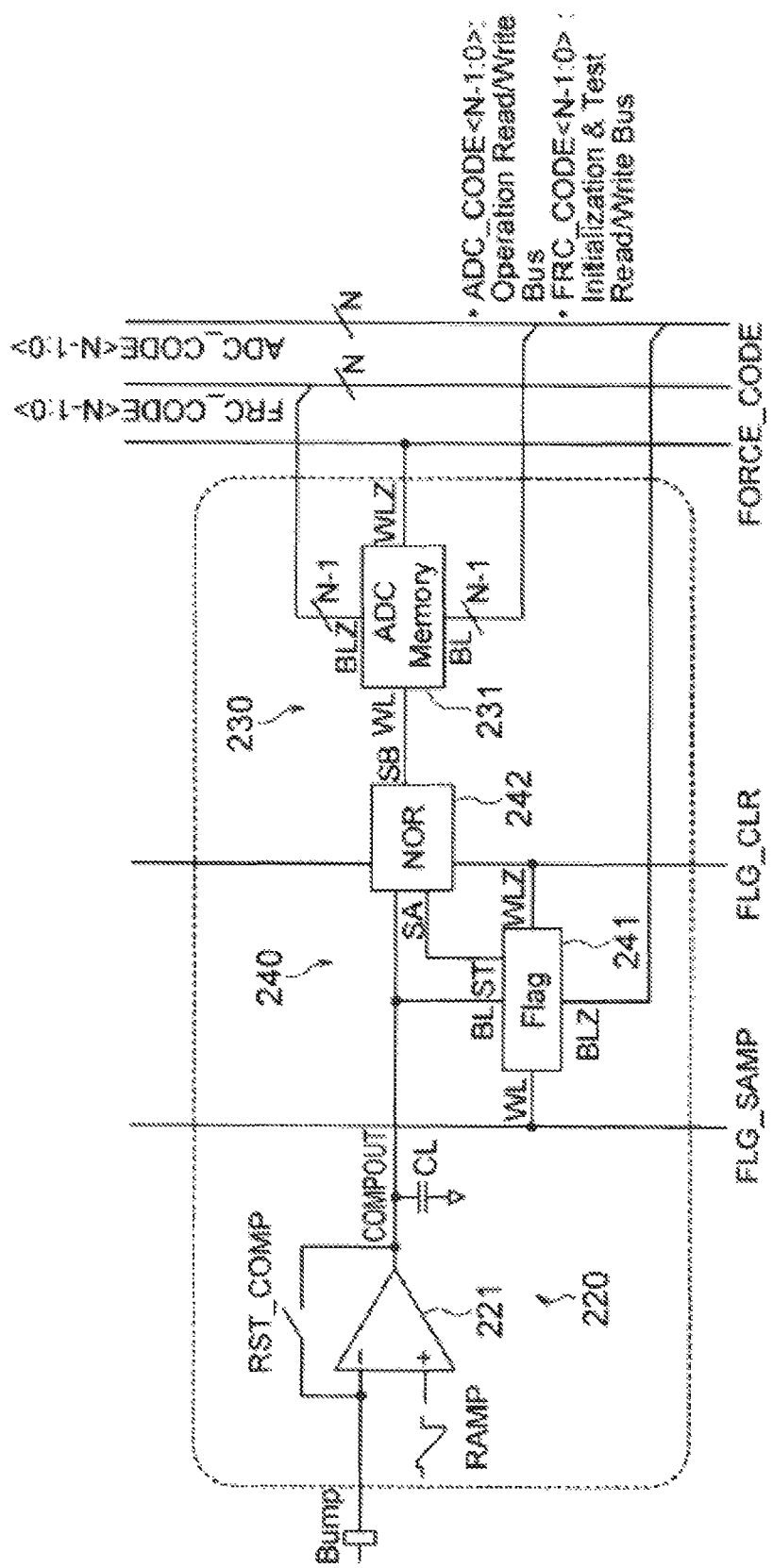
FIG. 22 is used to illustrate an example configuration of the main parts of the memory control part relating to the first embodiment of the present invention.
Figure 23:
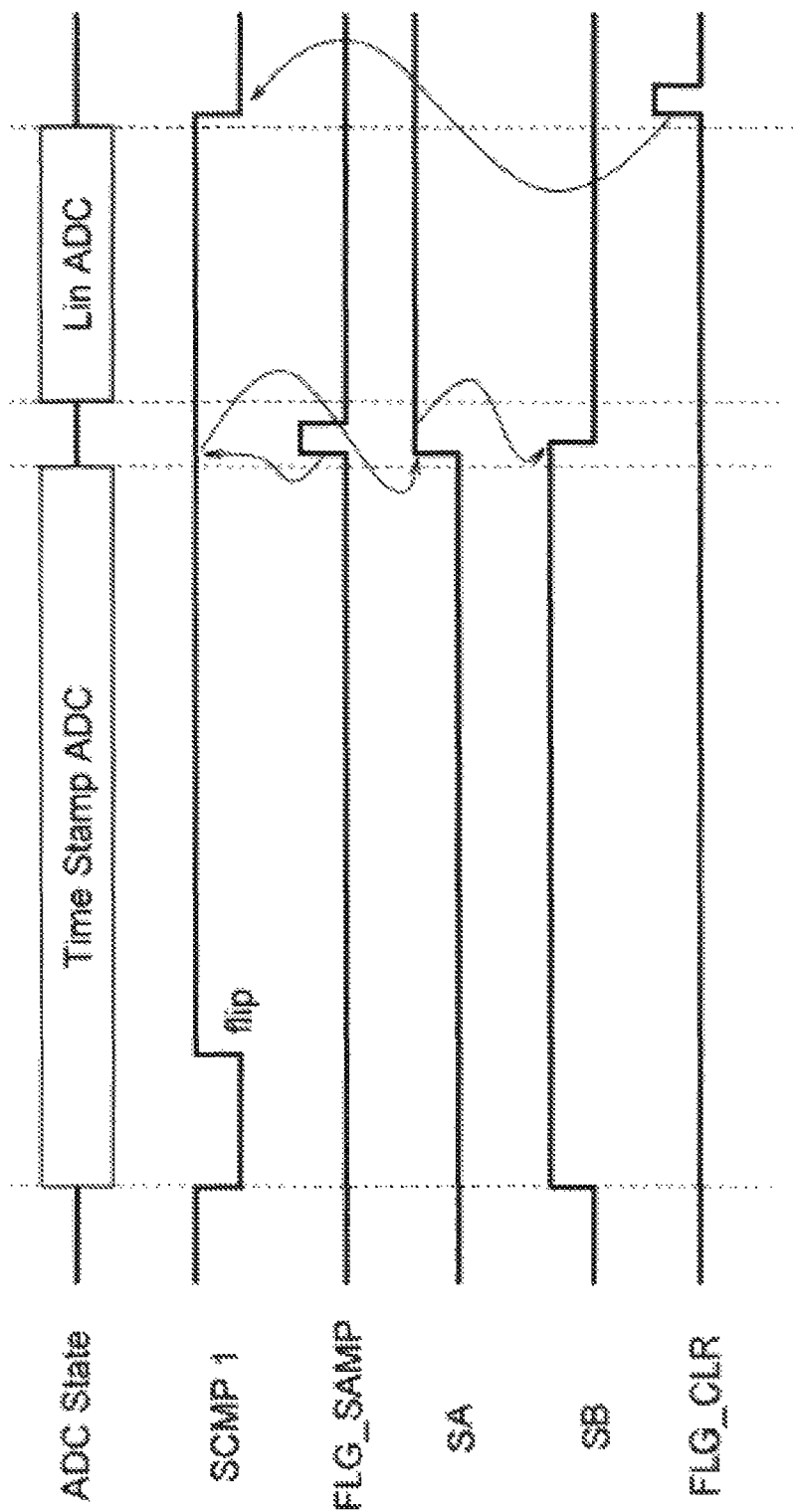
FIG. 23 is a timing chart for illustrating operations performed by the memory control part when the output from the comparator is inversed in a time stamp ADC mode.
Figure 24:
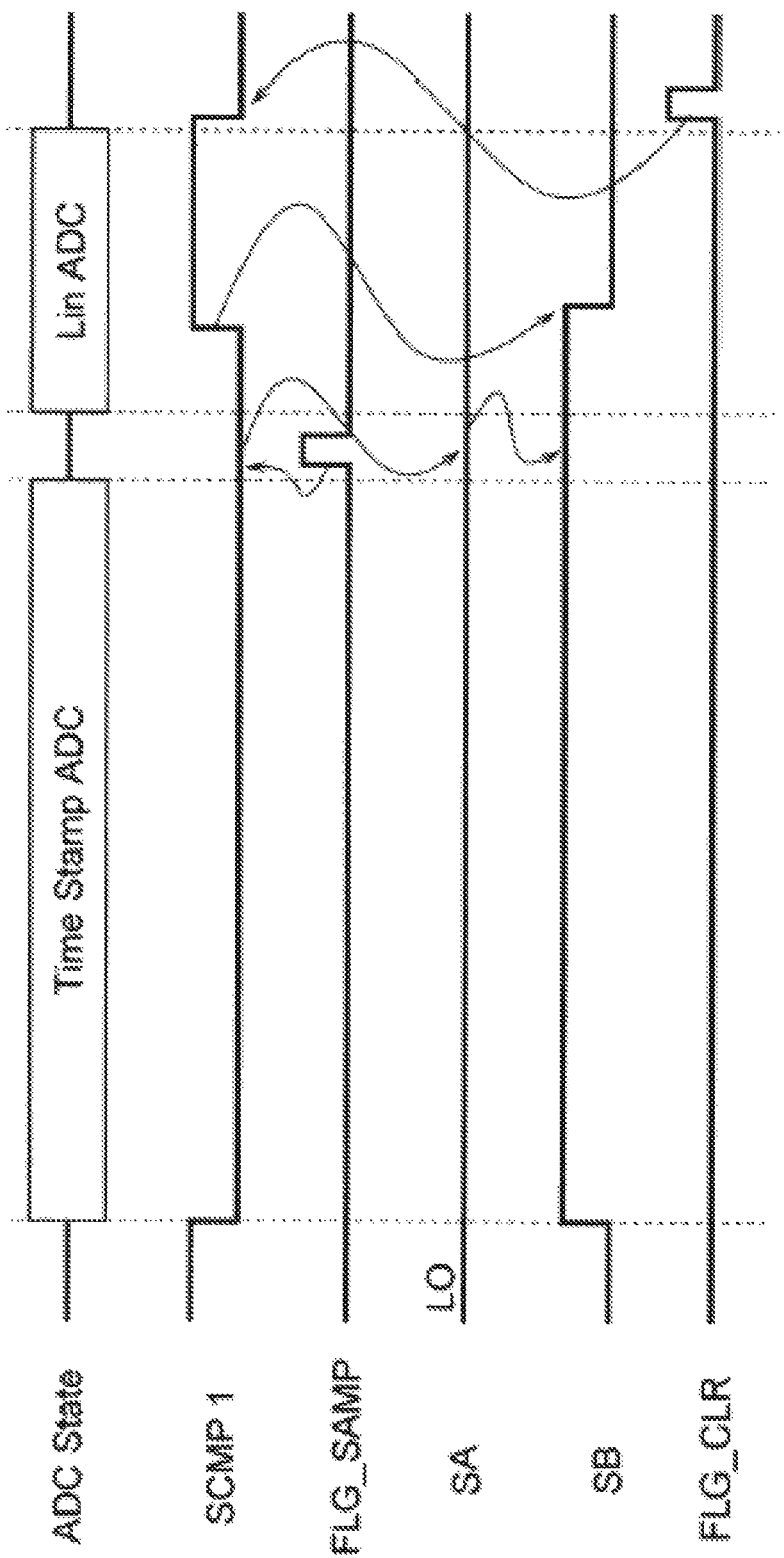
FIG. 24 is a timing chart for illustrating operations performed by the memory control part when the output from the comparator is not inversed in the time stamp ADC mode.

FIG. 22 is used to illustrate an example configuration of the main parts of the memory control part 240 relating to the first embodiment of the present invention. FIG. 23 is a timing chart for illustrating operations performed by the memory control part when the output from the comparator is inversed in the time stamp ADC mode. FIG. 24 is a timing chart for illustrating operations performed by the memory control part when the output from the comparator is not inversed in the time stamp ADC mode.

The memory control part 240 shown in FIG. 22 includes a flag bit memory cell (Flag) 241 and a NOR circuit 242, which serves as a gate circuit.

The flag bit memory cell 241 receives a flag sampling signal FLG_SAMP and the first comparison result signal SCMP1 obtained as a result of the first comparing operation CMPR1 fed thereto. When receiving the flag sampling signal FLG_SAMP fed thereto after the end of the first comparing operation period PCMPR1, the flag bit memory cell 241 sets a signal SA to the second level (High level) and outputs the resulting signal SA to the NOR circuit 242 if the level of the first comparison result signal SCMP1 obtained as a result of the first comparing operation CMPR1 has changed from the first level (Low level) to the second level (High level). When receiving the flag sampling signal FLG_SAMP fed thereto after the end of the first comparing operation period PCMPR1, the flag bit memory cell 241 sets the signal SA to the first level (Low level) and outputs the resulting signal SA to the NOR circuit 242 if the level of the first comparison result signal SCMP1 obtained as a result of the first comparing operation CMPR1 has not changed from the first level (Low level) to the second level (High level).

The NOR circuit 242 receives the output signal SA from the flag bit memory cell 241 and the first comparison result signal SCMP1 obtained as a result of the first comparing operation CMPR1 fed thereto. When receiving the signal SA at the second level (High level) as the level of the first comparison result signal SCMP1 obtained as a result of the first comparing operation CMPR1 has changed from the first level (Low level) to the second level (the High level), the NOR circuit 242 sets a signal SB to the first level (Low level) and outputs the resulting signal SB to the memory part 230 so that the writing (overwriting) is prohibited. When receiving the signal SA at the first level (Low level) as the level of the first comparison result signal SCMP1 obtained as a result of the first comparing operation CMPR1 has not changed from the first level (Low level) to the second level (High level), the NOR circuit 242 sets the signal SB to the second level (High level) and outputs the resulting signal SB to the memory part 230 so that the writing (overwriting) is allowed.

The flag bit memory cell 241 constitutes part of the ADC memory 231. This means no overhead from the perspective of the layout and high area efficiency. In addition, when having the smallest possible size, the NOR circuit 242 can be constituted by four transistors (4T). This means minimum area overhead. As the memory control part 240 is provided, it is only one ADC memory that is needed even though the comparing operation is performed in two steps.

In the memory control part 240, as shown in FIG. 23, when the flag sampling signal FLG_SAMP is fed after the end of the first comparing operation period PCMPR1, the output signal SA from the flag bit memory cell 241 at the second level (High level) is input into the NOR circuit 242 if the level of the first comparison result signal SCMP1 obtained as a result of the first comparing operation CMPR1 has changed from the first level (Low level) to the second level (High level). Accordingly, the NOR circuit 242 sets the signal SB to the first level (the Low level) and outputs the resulting signal SB to the memory part 230, so that the writing (overwriting) is prohibited.

In the memory control part 240, as shown in FIG. 24, when the flag sampling signal FLG_SAMP is fed after the end of the first comparing operation PCMPR1, the output signal SA from the flag bit memory cell 241 at the first level (Low level) is input into the NOR circuit 242 if the level of the first comparison result signal SCMP1 obtained as a result of the first comparing operation CMPR1 has not changed from and stayed at the first level (Low level). Accordingly, the NOR circuit 242 sets the signal SB to the second level (the High level) and outputs the resulting signal SB to the memory part 230, so that the writing (overwriting) is allowed.

The flag bit memory cell 241 and the NOR circuit 242 are cleared to the initial state by a clear signal FLG_CLR after the end of the second comparing operation period PCMPR2 performed in the linear ADC mode.

The vertical scanning circuit 30 drives the photoelectric conversion reading part 210 of the digital pixel 200 through row-scanning control lines in shutter and reading rows, under the control of the timing control circuit 50. The vertical scanning circuit 30 feeds referential voltage levels VREF1, VREF2, VREF3 that are set in accordance with the first, second and third comparing operations CMPR1, CMPR2 and CMPR3, to the comparator 221 of each digital pixel 200, under the control of the timing control circuit 50. Further, the vertical scanning circuit 30 outputs, according to an address signal, row selection signals indicating the row addresses of the reading row from which signals are to be read out and the shutter row in which the charges stored in the photodiodes PD are to be reset.

The output circuit 40 includes, as shown in, for example, FIG. 18, an IO buffer 41 arranged in correspondence with the output from the memory in each of the digital pixels 200 in the pixel part 20 and outputs the digital data read from each digital pixel 200 to outside.

The timing control circuit 50 generates timing signals required for signal processing in the pixel part 20, the vertical scanning circuit 30, the output circuit 40, and the like.

In the first embodiment, the reading part 60 controls the reading of the pixel signal from the digital pixel 200 in, for example, the global shutter mode. The reading part 60 can also control the connection (coupling) between the floating diffusion FD1, which serves as an output node, and the storage capacitor CS1, which stores charges from the floating diffusion FD1 through the storage transistor CG1-Tr, such that the connection (coupling) may be provided selectively depending on the signal illuminance.

<Stacked Structure of Solid-State Imaging Device 10>

The following describes the stacked structure of the solid-state imaging device 10 relating to the first embodiment.

Figure 25A:
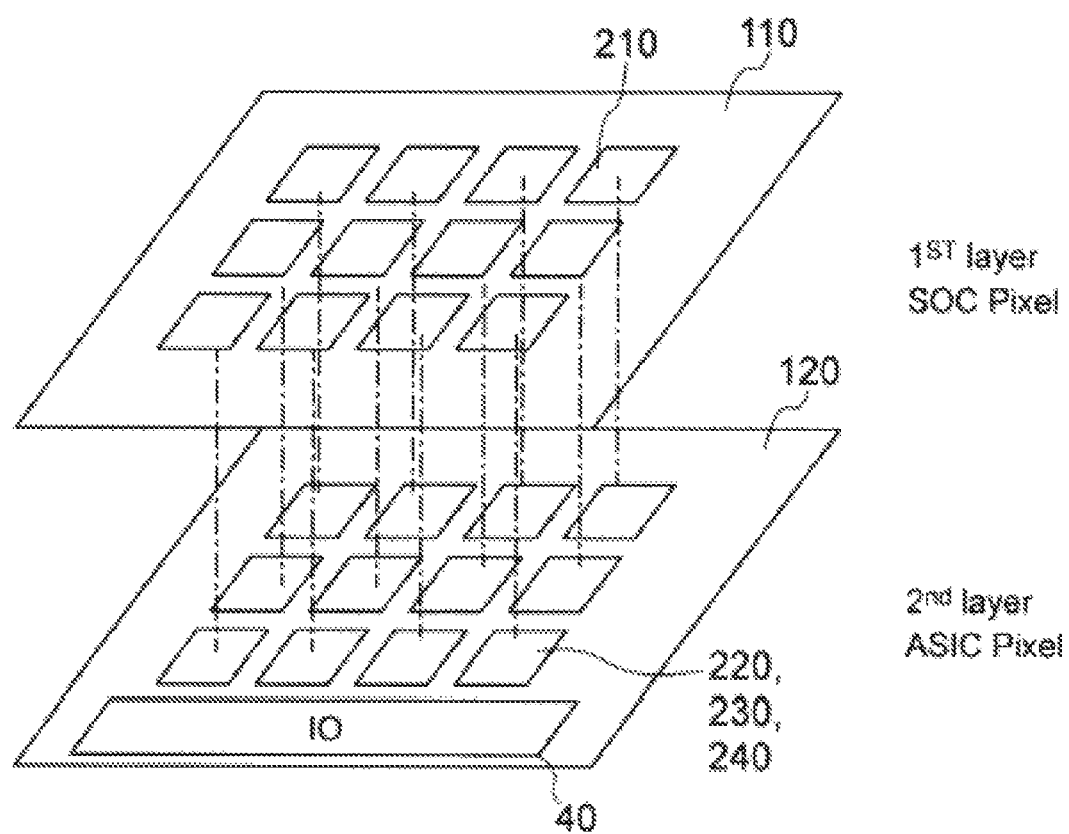
FIGS. 25A and 25B are schematic views to illustrate the stacked structure of the solid-state imaging device relating to the first embodiment.
Figure 25B:
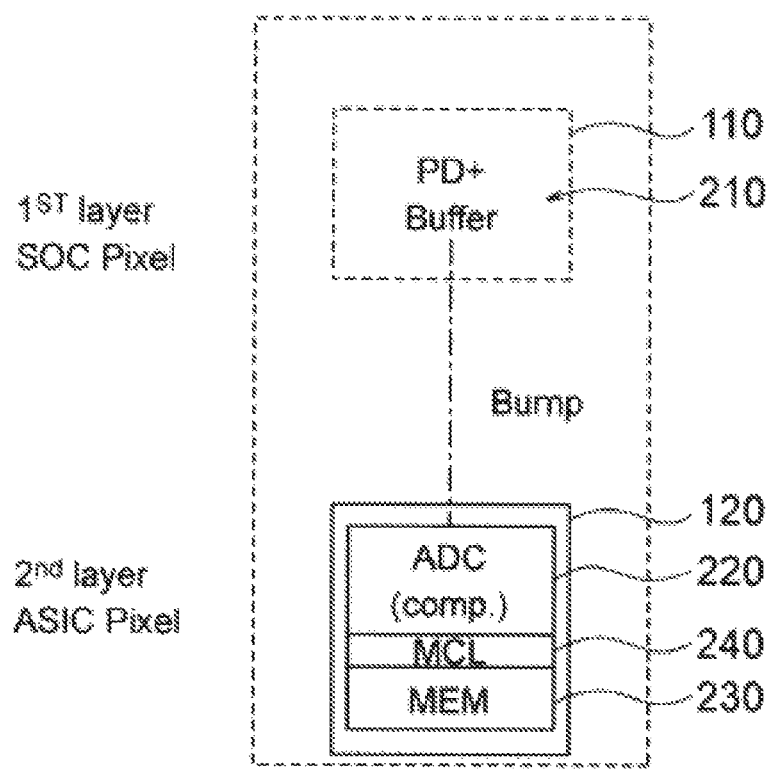
Figure 26:
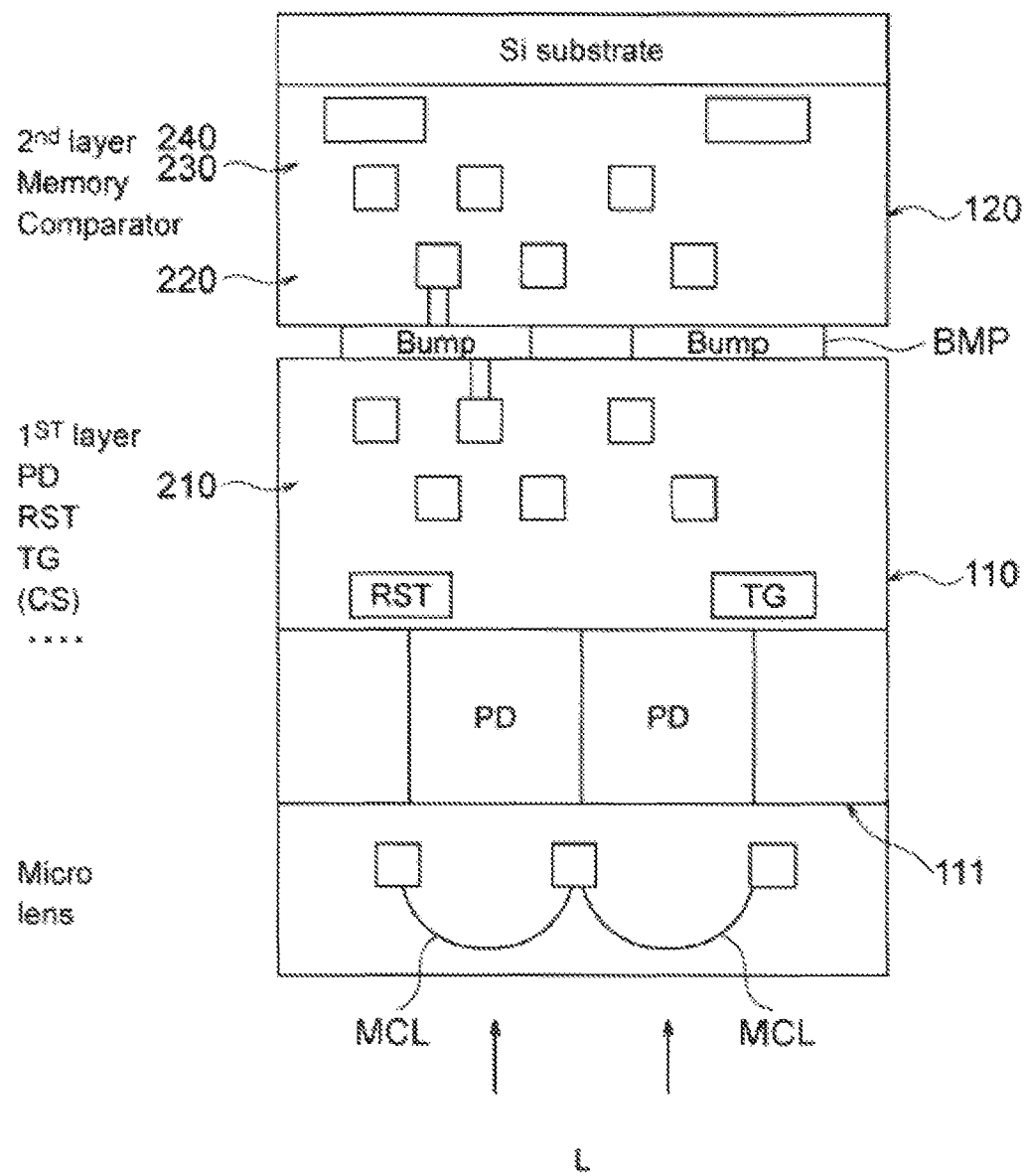
FIG. 26 is a simplified sectional view to illustrate the stacked structure of the solid-state imaging device relating to the first embodiment.

FIGS. 25A and 25B are schematic views to illustrate the stacked structure of the solid-state imaging device 10 relating to the first embodiment. FIG. 26 is a simplified sectional view to illustrate the stacked structure of the solid-state imaging device 10 relating to the first embodiment.

The solid-state imaging device 10 relating to the first embodiment has a stacked structure of a first substrate (an upper substrate) 110 and a second substrate (a lower substrate) 120. The solid-state imaging device 10 is formed as an imaging device having a stacked structure that is obtained, for example, by bonding wafers together and subjecting the bonded wafers to dicing. In the present example, the first substrate 110 and the second substrate 120 are stacked.

In the first substrate 110, the photoelectric conversion reading parts 210 of the digital pixels 200 of the pixel part 20 are arranged and centered around the central portion of the first substrate 110. In the first substrate 110, the photodiode PD is formed on a first surface 111 side thereof onto which light L is incident. On the light incident surface of the photodiode PD, a microlens MCL and a color filter are formed. In the first substrate 110, the transfer transistor TG1-Tr, the reset transistor RST1-Tr, the storage transistor CG1-Tr, the source follower transistor SF1-Tr, and the current transistor IC1-Tr are formed on a second surface side thereof.

As described above, basically in the first embodiment, the photoelectric conversion reading parts 210 of the digital pixels 200 are arranged in a matrix pattern in the first substrate 110.

In the second substrate 120, the AD converting parts 220, memory parts 230, memory control parts 240 of the digital pixels 200 are arranged in a matrix pattern. In the second substrate 120, the vertical scanning circuit 30, output circuit 40 and timing control circuit 50 may be also formed.

In the above-described stacked structure, the reading nodes ND2 of the photoelectric conversion reading parts 210 in the first substrate 110 are electrically connected to the inversion input terminals (−) of the comparators 221 of the digital pixels 200 in the second substrate 120 through vias (die-to-die vias), microbumps BMP, the signal lines LSGN1 or the like as shown in FIG. 3, for example. Furthermore, in the present embodiment, the reading nodes ND2 of the photoelectric conversion reading parts 210 in the first substrate 110 are AC coupled to the inversion input terminals (−) of the comparators 221 of the digital pixels 200 in the second substrate 120 through the coupling capacitors C221.

<Reading Operation of Solid-State Imaging Device 10>

The above describes the characteristic configurations and functions of the parts of the solid-state imaging device 10. Next, a detailed description will be given of the reading operation of the pixel signal from the digital pixel 200 in the solid-state imaging device 10 relating to the first embodiment.

Figure 27:
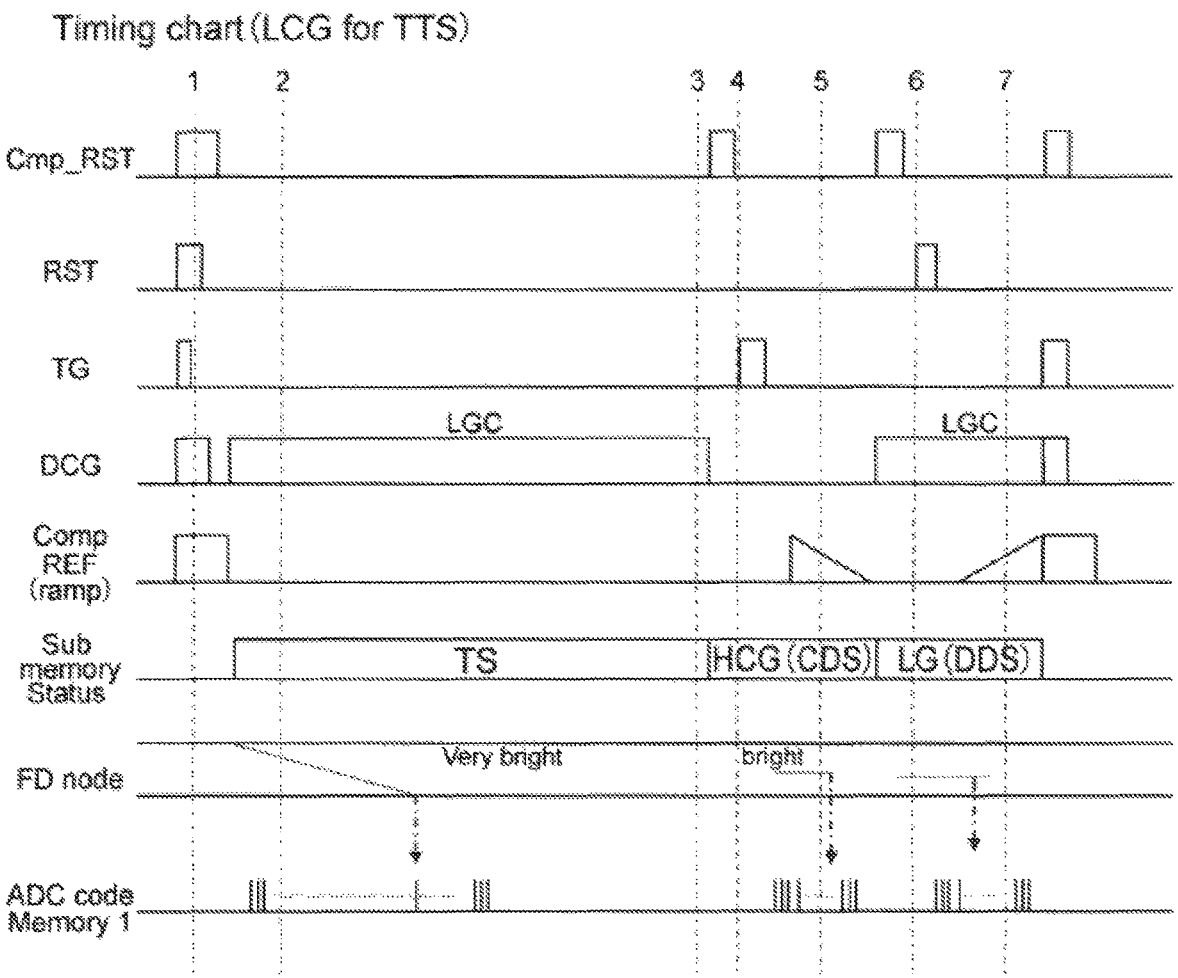
FIG. 27 is a timing chart to illustrate a reading operation performed by the solid-state imaging device relating to the first embodiment of the present invention in a predetermined shutter mode.
Figure 28:
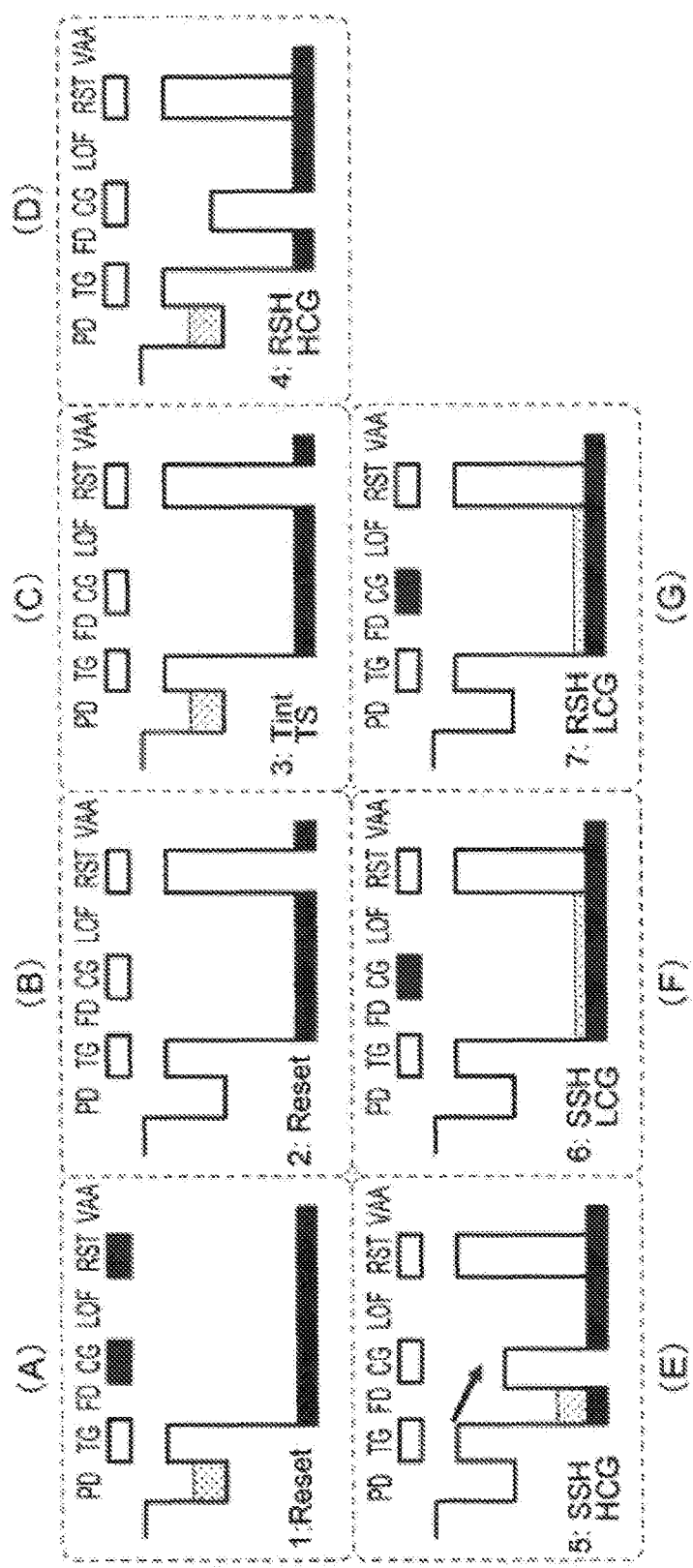
FIG. 28 illustrates a sequence of operations and potential transition to explain a reading operation performed mainly by the pixel part of the solid-state imaging device relating to the first embodiment of the present invention in a predetermined shutter mode.
Figure 29:
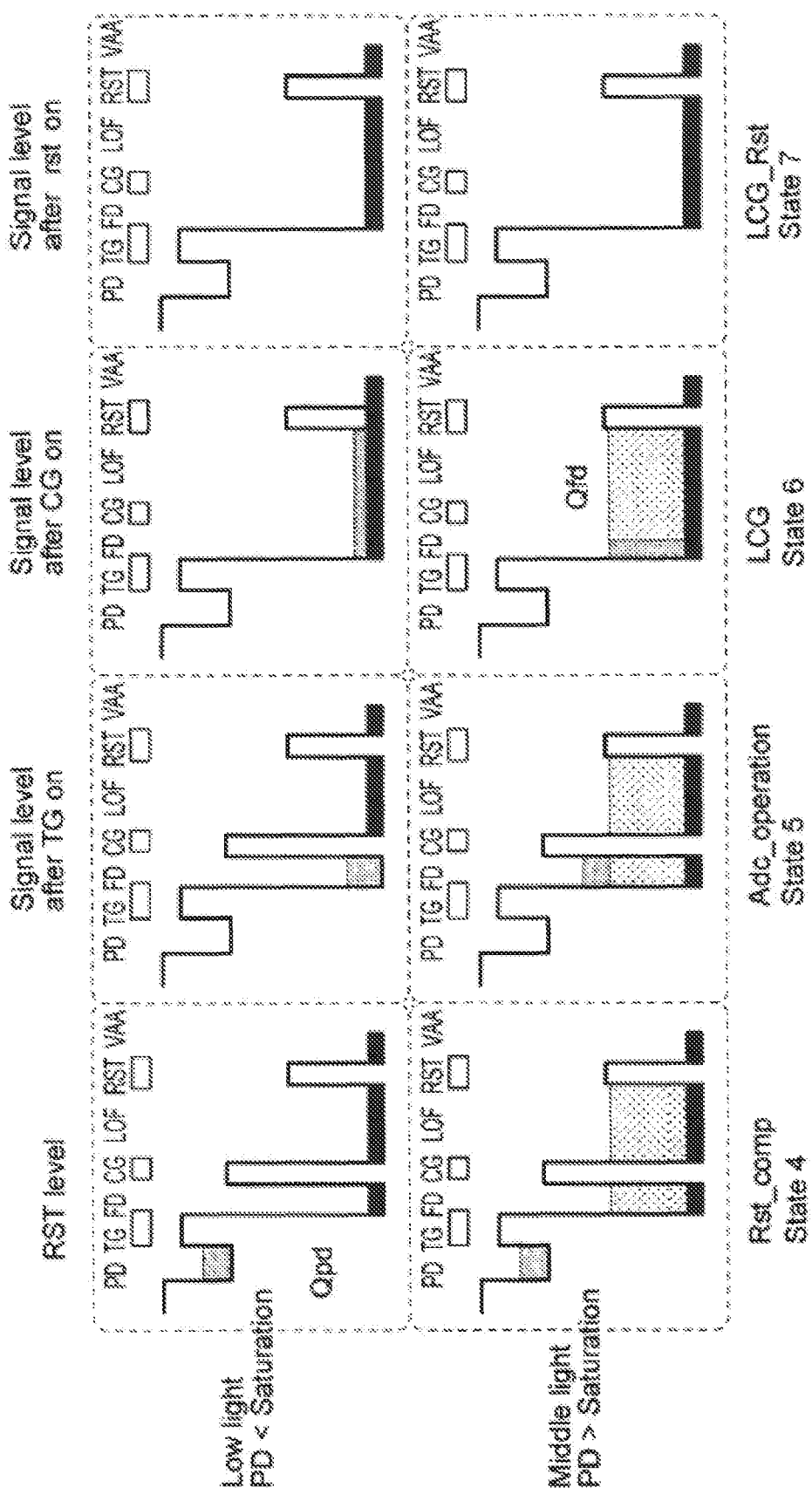
FIG. 29 illustrates a sequence of operations and potential transition, including the photodiode in the non-saturated or saturated state, in a reading operation performed mainly by the pixel part of the solid-state imaging device relating to the first embodiment of the present invention in a predetermined shutter mode.

FIG. 27 is a timing chart to illustrate a reading operation performed by the solid-state imaging device relating to the first embodiment of the present invention in a predetermined shutter mode. FIG. 28 includes parts (A) to (G) illustrating a sequence of operations and potential transition to explain a reading operation performed mainly by the pixel part of the solid-state imaging device relating to the first embodiment of the present invention in a predetermined shutter mode. FIG. 29 includes parts (A) to (H) illustrating a sequence of operations and potential transition, including the photodiode in the non-saturated or saturated state, in a reading operation performed mainly by the pixel part of the solid-state imaging device relating to the first embodiment of the present invention in a predetermined shutter mode. In FIG. 29, the parts (A) to (D) show how the potential transitions in the non-saturated state, and the parts (E to (H) shows how the potential transitions in the saturated state.

In order to start the reading operation, global resetting is performed to reset the photodiode PD1 and the floating diffusion FD1 in each digital pixel 200 as shown in FIG. 27 and the part (A) in FIG. 28. According to the global resetting, the reset transistor RST1-Tr, the transfer transistor TG1-Tr and the storage transistor CG1-Tr are brought into and remain in the conduction state for a predetermined period of time at the same time in all of the pixels, so that the photodiode PD1 and the floating diffusion FD1 are reset. Subsequently, as shown in FIG. 27 and the part (B) in FIG. 28, the storage transistor CG1-Tr remains in the non-conduction state for a predetermined period of time for the global resetting and reset sampling. Following this, as shown in FIG. 27 and the part (C) in FIG. 28, the reset transistor RST1-Tr and the transfer transistor TG1-Tr are brought into the non-conduction state and the storage transistor CG1-Tr is brought into the conduction state at the same time in all of the pixels, so that the exposure is started, in other words, the charges start to be stored in all of the pixels concurrently in parallel.

Then, as shown in FIG. 27 and the part (C) in FIG. 28, the time stamp (TS) ADC mode operation for the overflow charges starts. The overflow charges are stored in the floating diffusion FD1 in the storing period PI. The time stamp ADC mode lasts for the storing period PI, more specifically, for a period within the storing period PI until the comparing operation is completed.

In the time stamp (TS) ADC mode, the photoelectric conversion reading part 210 outputs, correspondingly to the first comparing operation period PCMPR1 of the AD converting part 220, the voltage signal VSL1 corresponding to the overflow charges overflowing from the photodiode PD1 to the floating diffusion FD1 serving as an output node in the storing period PI. The comparator 221 of the AD converting part 220 performs the first comparing operation CMPR1. Under the control of the reading part 60, the comparator 221 outputs the digital first comparison result signal SCMP1 obtained by processing the voltage signal VSL1 corresponding to the overflow charges overflowing from the photodiode PD1 to the floating diffusion FD1 serving as an output node within a certain period that is included in the storing period PI and lasts until the comparing operation is completed, and digital data corresponding to the first comparison result signal SCMP1 is stored in the memory 231 of the memory part 230.

Next, as shown in FIG. 27 and the part (D) in FIG. 28, the time stamp (TS) ADC mode operation for the overflow charges ends, the linear ADC mode starts and the reset period PR2 for the comparator 221 starts. In the reset period PR2, the reset transistor RST1-Tr remains in the non-conduction state for a predetermined period of time, so that the floating diffusion FD1 is reset. The signal (VRST) in the floating diffusion is read out, and the digital signal is stored in the memory 231 in the memory part 230.

Following this, as shown in FIG. 27 and the part (E) in FIG. 28, the storing period PI ends and the transfer period PT starts. In the transfer period PT, the transfer transistor TG1-Tr remains in the conduction state for a predetermined period of time, so that the charges stored in the photodiode PD1 are transferred to the floating diffusion FD1.

In the linear (Lin) ADC mode, the photoelectric conversion reading part 210 outputs, correspondingly to the second comparing operation period PCMP2 of the AD converting part 220, the voltage signal VSL2 corresponding to the stored charges transferred from the photodiode PD1 to the floating diffusion FD1 serving as an output node, after the storing period PI ends. At this point, the solid-state imaging device 10 is in the HCG mode, and the storage transistor CG1-Tr remains in the non-conduction state. The comparator 221 of the AD converting part 220 performs the second comparing operation CMPR2. Under the control of the reading part 60, the comparator 221 outputs the digital second comparison result signal SCMP2 obtained by processing the voltage signal VSL2 corresponding to the stored charges transferred from the photodiode PD1 to the floating diffusion FD1 serving as an output node, after the storing period PI, and digital data corresponding to the second comparison result signal SCMP2 is stored in the memory 231 of the memory part 230.

During the above-described series of operations, the memory control part 240 controls whether to allow the writing of the data corresponding to the second comparison result signal SCMP2 obtained as a result of the second comparing operation CMPR2 into the memory part 230, depending on the state (the output level) of the first comparison result signal SCMP1 obtained as a result of the first comparing operation CMPR1. More specifically, the memory control part 240 prohibits the writing of the data corresponding to the second comparison result signal SCMP2 obtained as a result of the second comparing operation CMPR2 into the memory part 230, if the level of the first comparison result signal SCMP1 obtained as a result of the first comparing operation CMPR1 changes from the first level (for example, Low level) to the second level (High level) in the first comparing operation period PCMPR1. On the other hand, the memory control part 240 allows the writing of the data corresponding to the second comparison result signal SCMP2 obtained as a result of the second comparing operation CMPR2 into the memory part 230 if the level of the first comparison result signal SCMP1 obtained as a result of the first comparing operation CMPR1 stays at and does not change from the first level (Low level) in the first comparing operation period PCMPR1.

Subsequently, as shown in FIG. 27 and the part (F) in FIG. 28, the storage transistor CG1-Tr remains in the conduction state and the transfer transistor TG1-Tr remains in the conduction state for a predetermined period of time, so that the voltage signal VSL3 corresponding to the sum of the stored charges transferred from the photodiode PD1 to the floating diffusion FD1 and the stored charges transferred from the storage capacitor CS1 to the floating diffusion FD1 is output. At this point, the solid-state imaging device 10 is in the LCG mode, and the storage transistor CG1-Tr remains in the conduction state. The comparator 221 of the AD converting part 220 performs the third comparing operation CMPR3. Under the control of the reading part 60, the comparator 221 samples, after the storing period PI, the voltage signal corresponding to the sum of the stored charges transferred from the photodiode PD1 to the floating diffusion FD1 serving as an output node and the stored charges transferred from the storage capacitor CS1 to the floating diffusion FD1.

Subsequently, as shown in FIG. 27 and the part (G) in FIG. 28, the reset period PR2 for the floating diffusion FD1 starts. In the reset period PR2, the reset transistor RST1-Tr remains in the conduction state for a predetermined period of time, so that the floating diffusion FD1 is reset. The signal (VRST) at the time of resetting is read out from the floating diffusion FD1, the digital third comparison result signal SCMP3 obtained by processing the voltage signal VSL3 is output, and digital data corresponding to the third comparison result signal SCMP3 is stored in the memory 231 of the memory part 230. After this, the reset transistor RST1-Tr is brought into the non-conduction state.

The memory control part 240 controls whether to allow writing of the data corresponding to the third comparison result signal obtained as a result of the third comparing operation into the first memory 231, depending on the state of the first comparison result signal obtained as a result of the first comparing operation and the state of the second comparison result signal obtained as a result of the second comparing operation. More specifically, the memory control part 240 allows the writing (overwriting) of the data corresponding to the third comparison result signal SCMP3 obtained as a result of the third comparing operation CMPR3 into the first memory 231 if the level of the second comparison result signal SCMP2 obtained as a result of the second comparing operation CMPR2 stays at and does not change from the second level (High level) in the second comparing operation period PCMPR2.

The signal read out by the memory part 230 is sent outside the solid-state imaging device 10 (image sensor) via, for example, the IO buffer 41 of the output circuit 40, which is driven by reading the digital signal data from the memory node and has such an MIPI data format. This operation is globally performed in all of the pixels in the pixel array.

As described above, in the solid-state imaging device 10 relating to the first embodiment, the pixel part 20 includes digital pixels, and each digital pixel includes the photoelectric conversion reading part 210, the AD converting part 220, and the memory part 230. The solid-state imaging device 10 is configured, for example, as a stacked CMOS image sensor capable of operating in a global shutter mode.

In the solid-state imaging device 10 relating to the first embodiment, each digital pixel 200 has an AD converting function, and the AD converting part 220 includes the comparator 221 for performing a comparing operation of comparing the voltage signal read out from the photoelectric conversion reading part 210 against the referential voltage and outputting a digital comparison result signal. Under the control of the reading part 60, the comparator 221 performs a first comparing operation CMPR1, a second comparing operation CMPR2 and a third comparing operation CMPR3. The first comparing operation CMPR1 is designed to output a digital first comparison result signal SCMP1 obtained by processing the voltage signal corresponding to the overflow charges overflowing from the photodiode PD1 to the output node (the floating diffusion) FD1 in the storing period. The second comparing operation CMPR2 is designed to output a digital second comparison result signal SCMP2 obtained by processing the voltage signal corresponding to the charges stored in the photodiode PD1 that are transferred to the floating node FD1 (output node) in the transfer period following the storing period. The third comparing operation CMPR3 is designed to output a digital third comparison result signal SCMP3 obtained by processing the voltage signal corresponding to the sum of the charges stored in the photodiode PD1 that are transferred to the output node in the transfer period following the storing period and the charges stored in the charge storing part 212.

The solid-state imaging device 10 further includes the memory control part 240 for controlling access made to the memory part depending on a state (in the present embodiment, the level) of the comparison result signal from the comparator 221. The memory control part 240 controls whether to allow the writing of the data corresponding to the second comparison result signal SCMP2 obtained as a result of the second comparing operation CMPR2 into the memory part 230, depending on the state (the output level) of the first comparison result signal SCMP1 obtained as a result of the first comparing operation CMPR1. To be more specific, the memory control part 240 prohibits the writing of the data corresponding to the second comparison result signal SCMP2 obtained as a result of the second comparing operation CMPR2 into the memory part 230 if the level of the first comparison result signal SCMP1 obtained as a result of the first comparing operation CMPR1 changes from the first level (for example, Low level) to the second level (High level) in the first comparing operation period PCMPR1. On the other hand, the memory control part 240 allows the writing of the data corresponding to the second comparison result signal SCMP2 obtained as a result of the second comparing operation CMPR2 into the memory part 230 if the level of the first comparison result signal SCMP1 obtained as a result of the first comparing operation CMPR1 stays at and does not change from the first level (Low level) in the first comparing operation period PCMPR1. Furthermore, the memory control part 240 controls whether to allow writing of the data corresponding to the third comparison result signal obtained as a result of the third comparing operation into the first memory 231, depending on the state of the first comparison result signal obtained as a result of the first comparing operation and the state of the second comparison result signal obtained as a result of the second comparing operation. More specifically, the memory control part 240 allows the writing (overwriting) of the data corresponding to the third comparison result signal SCMP3 obtained as a result of the third comparing operation CMPR3 into the first memory 231 if the level of the second comparison result signal SCMP2 obtained as a result of the second comparing operation CMPR2 stays at and does not change from the second level (High level) in the second comparing operation period PCMPR2.

Therefore, the solid-state imaging device 10 relating to the first embodiment is capable of achieving a widened dynamic range and a raised frame rate since the charges overflowing from the photodiode in the storing period can be used real time and allows efficient access to memory. Additionally, the present invention is capable of substantially achieving a widened dynamic range and a raised frame rate, allowing efficient access to memory, achieving reduced noise, and maximizing the effective pixel region and value per cost.

Additionally, the solid-state imaging device 10 relating to the first embodiment can prevent the increase in the configuration complexity and the reduction in area efficiency from the perspective of layout.

The solid-state imaging device 10 relating to the first embodiment has a stacked structure of the first substrate (an upper substrate) 110 and the second substrate (a lower substrate) 120. Accordingly, the first embodiment can maximize the value per cost since the first substrate 110 is basically formed only with NMOS elements and the pixel array can increase the effective pixel region to the maximum.

Second Embodiment

Figure 30:
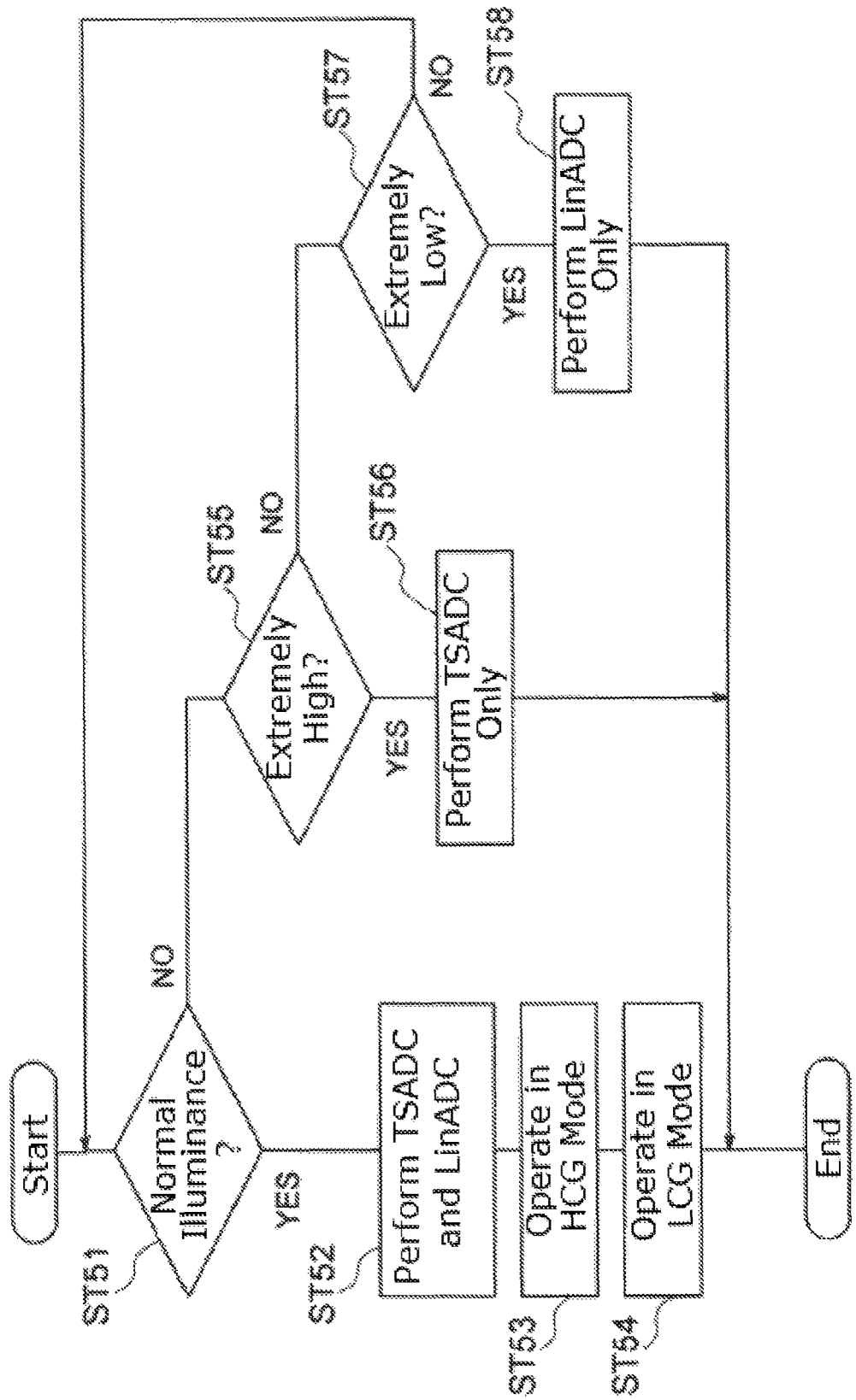
FIG. 30 is used to illustrate a solid-state imaging device relating to a second embodiment of the present invention and shows, as an example, how to make a selection between a time stamp ADC mode operation and a linear ADC mode operation.

FIG. 30 is used to illustrate a solid-state imaging device relating to a second embodiment of the present invention and shows, as an example, how to make a selection between a time stamp ADC mode operation and a linear ADC mode operation.

A solid-state imaging device 10A relating to the second embodiment differs from the solid-state imaging device 10 relating to the above-described first embodiment in the following points. The solid-state imaging device 10 relating to the first embodiment of the present invention operates in the time stamp (TS) ADC mode and the linear (Lin) ADC mode successively.

The solid-state imaging device 10A relating to the second embodiment of the present invention, on the other hand, can selectively operate in the time stamp (TS) ADC mode and the linear (Lin) ADC mode depending on the illuminance.

According to the example shown in FIG. 21, in the case of normal illuminance (ST51), the solid-state imaging device 10A successively operates in the time stamp ADC mode and the linear ADC mode (ST52). In this case, in the linear ADC mode, the solid-state imaging device 10A operates in the HCG mode and the LCG mode (ST53, ST54). When the illuminance is not normal but very (extremely) high (ST51, ST55), the solid-state imaging device 10A operates only in the time stamp ADC mode (ST56) since there is a high possibility that the charges may overflow from the photodiode PD1 to the floating diffusion FD1. When the illuminance is neither normal nor very (extremely) high, but very (extremely) low (ST51, ST55, ST57), the solid-state imaging device 10A operates only in the linear ADC mode (ST58) since there is a very low possibility that the charges may overflow from the photodiode PD1 to the floating diffusion FD1.

The second embodiment makes it possible not only to obtain the same effect as the first embodiment described above, but also to realize faster reading operation and achieve lower power consumption.

Third Embodiment

Figure 31:
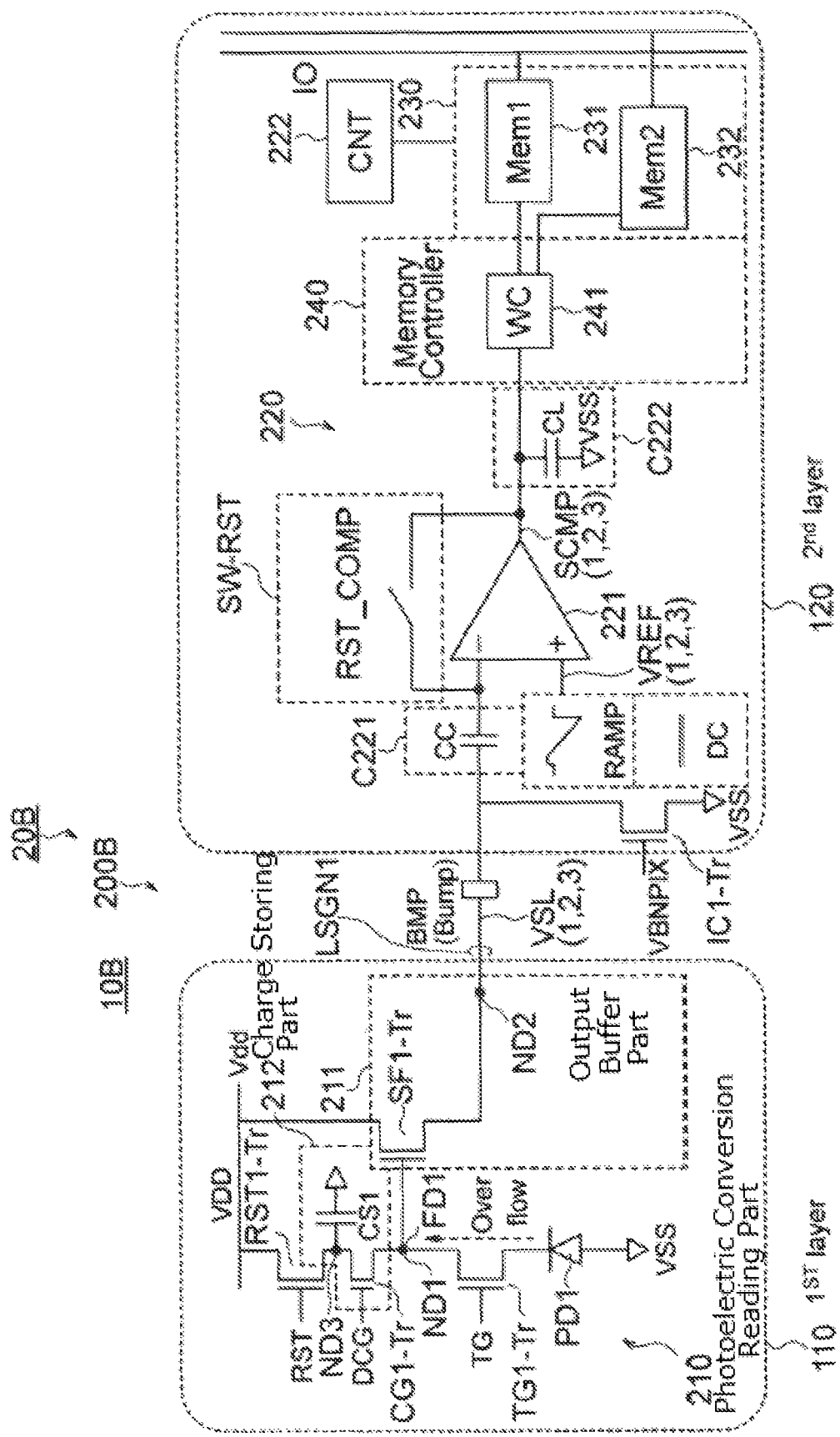
FIG. 31 is a circuit diagram showing an example pixel of a solid-state imaging device relating to a third embodiment of the present invention.

FIG. 31 is a diagram showing an example configuration of a pixel of a solid-state imaging device relating to a third embodiment of the present invention.

A solid-state imaging device 10B relating to the third embodiment differs from the solid-state imaging device 10 relating to the above-described first embodiment in the following points. In the solid-state imaging device 10B relating to the third embodiment, the current transistor IC1-Tr serving as a current source is not arranged on the first substrate 110 but arranged, for example, on the second substrate 120 at the input of the AD converting part 220.

The third embodiment can produce the same effects as the above-described first embodiment.

The solid-state imaging devices 10, 10A, 10B described above can be applied, as an imaging device, to electronic apparatuses such as digital cameras, video cameras, mobile terminals, surveillance cameras, and medical endoscope cameras.

Figure 32:
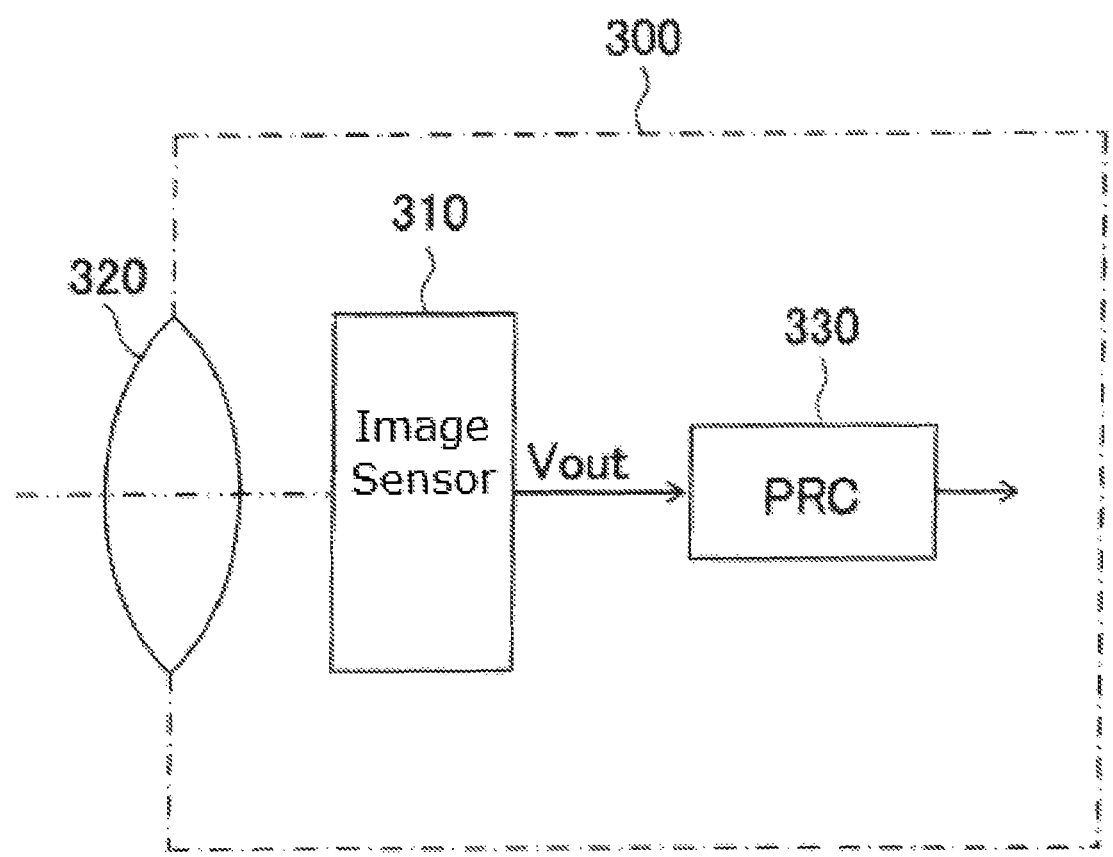
FIG. 32 shows an example configuration of an electronic apparatus to which the solid-state imaging devices relating to the embodiments of the present invention can be applied.

FIG. 32 shows an example of the configuration of an electronic apparatus including a camera system to which the solid-state imaging device according to the embodiments of the present invention is applied.

As shown in FIG. 32, the electronic apparatus 300 includes a CMOS image sensor 310 that can be constituted by the solid-state imaging device 10 according to the embodiments of the present invention. Further, the electronic apparatus 300 includes an optical system (such as a lens) 320 for redirecting the incident light to pixel regions of the CMOS image sensor 310 (to form a subject image). The electronic apparatus 300 includes a signal processing circuit (PRC) 330 for processing output signals of the CMOS image sensor 310.

The signal processing circuit 330 performs predetermined signal processing on the output signals of the CMOS image sensor 310. The image signals processed in the signal processing circuit 330 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10, 10A, 10B as the CMOS image sensor 310. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:

1. A solid-state imaging device comprising:
   a pixel part having a pixel arranged therein, the pixel performing photoelectric conversion; and
   a reading part for reading a pixel signal from the pixel in the pixel part,
   wherein the pixel includes:
      a photoelectric conversion element for storing therein, in a storing period, charges generated by the photoelectric conversion;
      a transfer element for transferring, in a transfer period following the storing period, the charges stored in the photoelectric conversion element;
      an output node to which the charges stored in the photoelectric conversion element are transferred through the transfer element;

an output buffer part for converting the charges at the output node into a voltage signal at a level determined by the amount of the charges and outputting the voltage signal;

a charge storing part for storing overflow charges overflowing at least from the photoelectric conversion element to the output node;

a comparator for performing a comparing operation of comparing the voltage signal output from the output buffer part against a referential voltage to output a digital comparison result signal;

a memory part for saving data corresponding to the comparison result signal from the comparator; and a memory control part for controlling access to the memory part depending on a state of the comparison result signal from the comparator, wherein the comparator is configured to perform, under control of the reading part:

a first comparing operation for outputting a digital first comparison result signal obtained by processing the voltage signal corresponding to the overflow charges overflowing from the photoelectric conversion element to the output node in the storing period;

a second comparing operation for outputting a digital second comparison result signal obtained by processing the voltage signal corresponding to charges stored in the photoelectric conversion element that are transferred to the output node in the transfer period following the storing period; and a third comparing operation for outputting a digital third comparison result signal obtained by processing the voltage signal corresponding to a sum of (i) the charges stored in the photoelectric conversion element that are transferred to the output node in the transfer period following the storing period and (ii) charges stored in the charge storing part, and wherein the memory control part controls whether or not to allow writing of data corresponding to the third comparison result signal obtained as a result of the third comparing operation into the memory part, depending on a state of the first comparison result signal obtained as a result of the first comparing operation and a state of the second comparison result signal obtained as a result of the second comparing operation.

2. The solid-state imaging device according to claim 1, wherein the memory control part controls whether or not to allow writing of data corresponding to the second comparison result signal obtained as a result of the second comparing operation into the memory part, depending on a state of the first comparison result signal obtained as a result of the first comparing operation.

3. The solid-state imaging device according to claim 2, wherein the memory control part prohibits the writing of the data corresponding to the second comparison result signal obtained as a result of the second comparing operation into the memory part, if a level of the first comparison result signal obtained as a result of the first comparing operation changes from a first level to a second level in a period of the first comparing operation.

4. The solid-state imaging device according to claim 2, wherein the memory control part allows the writing of the data corresponding to the second comparison result signal obtained as a result of the second comparing operation into the memory part, if a level of the first comparison result signal obtained as a result of the first comparing operation remains at and does not change from a first level in a period of the first comparing operation.

5. The solid-state imaging device according to claim 1, wherein the memory control part allows the writing of the data corresponding to the third comparison result signal obtained as a result of the third comparing operation into the memory part, if a level of the second comparison result signal obtained as a result of the second comparing operation remains at and does not change from a second level in a period of the second comparing operation.

6. The solid-state imaging device according to claim 2, wherein writing to the memory part is prohibited if a signal corresponding to the first comparison result signal obtained as a result of the first comparing operation is fed at a first level and allowed if fed at a second level, and wherein the memory control part:

when a sampling signal is fed after the period of the first comparing operation ends, feeds to the memory part the signal corresponding to the first comparison result signal at the first level if a level of the first comparison result signal obtained as a result of the first comparing operation has changed from a first level to a second level; and when a sampling signal is fed after the period of the first comparing operation ends, feeds to the memory part the signal corresponding to the first comparison result signal at the second level if a level of the first comparison result signal obtained as a result of the first comparing operation remains at and has not changed from a first level.

7. The solid-state imaging device according to claim 1, wherein the charge storing part includes:

a storage transistor connected to the output node; and a storage capacitance element for storing therein the charges in the output node via the storage transistor, and wherein the output node outputs:

the voltage signal corresponding to the charges stored in the photoelectric conversion element that are transferred to the output node in the transfer period following the storing period; and in a given period, the voltage signal corresponding to the overflow charges overflowing at least from the photoelectric conversion element to the output node, from among the charges in the photoelectric conversion element and the storage capacitance element.

8. The solid-state imaging device according to claim 1, wherein the output node is configured to retain a sum of adding together the charges stored in the photoelectric conversion element that are transferred by the transfer element in the transfer period following the storing period and the charges stored in the charge storing part.

9. The solid-state imaging device according to claim 1, wherein in the first comparing operation, the comparator outputs the first comparison result signal corresponding to a time determined by the amount of the overflow charges.

10. The solid-state imaging device according to claim 9, wherein in the first comparing operation, the comparator is configured to handle a light level as long as the light level produces a signal level ranging from (i) a signal level of the photoelectric conversion element obtained with a maximum value of a sampling time that is required to cause the overflow charges to start overflowing from the photoelectric conversion element to the output node to (ii) a signal level obtained with a minimum value of the sampling time.

11. The solid-state imaging device according to claim 1,
wherein the storing period is a period from when the photoelectric conversion element and the output node are reset to a reset level to when the transfer period starts as the transfer element is brought into a conduction state,
wherein the period of the first comparing operation is a period from when the photoelectric conversion element and the output node are reset to a reset level and to when the first comparing operation ends before the transfer period starts, and
wherein the period of at least the second comparing operation from among the second comparing operation and the third comparing operation is a period that starts after the first comparing operation ends and that includes a period after the transfer period.

12. The solid-state imaging device according to claim 1, wherein the charge storing part includes:
a storage transistor connected to the output node; and
a storage capacitance element for storing therein the charges in the output node via the storage transistor, and
wherein the reading part controls connection between the output node and the storage capacitance element for storing therein the charges in the output node via the storage transistor such that the connection is selectively provided depending on illuminance of a signal.

13. The solid-state imaging device according to claim 1, wherein the reading part controls the first comparing operation and the second comparing operation such that the first and second comparing operations are selectively performed depending on illuminance.

14. The solid-state imaging device according to claim 13, wherein the reading part performs the control such that the first, second and third comparing operations are performed if the illuminance is normal.

15. The solid-state imaging device according to claim 13, wherein the reading part performs the control such that the first comparing operation is performed if the illuminance is higher than normal illuminance.

16. The solid-state imaging device according to claim 13, wherein the reading part performs the control such that the second comparing operation is performed if the illuminance is lower than normal illuminance.

17. The solid-state imaging device according to claim 1, wherein the pixel includes:
a floating diffusion serving as the output node; and
a reset element for resetting, in a reset period, the floating diffusion to a predetermined potential, and
wherein the output buffer part includes:
a source follower element for converting charges in the floating diffusion into a voltage signal at a level determined by the amount of the charges and outputting the voltage signal; and
a current source connected to a source of the source follower element.

18. The solid-state imaging device according to claim 1, wherein the comparator
receives at a first input terminal thereof the voltage signal fed from the output buffer part, and
receives at a second input terminal thereof the referential voltage fed thereto, and
wherein a coupling capacitor is connected to a line to feed the voltage signal to the first input terminal.

19. The solid-state imaging device according to claim 1, wherein the comparator
has a reset switch connected between an output terminal and the first input terminal, and
has a load capacitor connected to the output terminal.

20. The solid-state imaging device according to claim 1, comprising:
a first substrate; and
a second substrate,
wherein the first substrate and the second substrate have a stacked structure in which the first substrate and the second substrate are connected through a connection part,
wherein the first substrate at least has the photoelectric conversion element, the transfer element, the output node and the output buffer part of the pixel formed therein, and
wherein the second substrate at least has at least a portion of the reading part, the memory control part, the memory part and the comparator formed therein.

21. The solid-state imaging device according to claim 20, wherein the pixel includes:
a floating diffusion serving as the output node; and
a reset element for resetting, in a reset period, the floating diffusion to a predetermined potential, and
wherein the output buffer part includes:
a source follower element for converting charges in the floating diffusion into a voltage signal at a level determined by the amount of the charges and outputting the voltage signal; and
a current source connected to a source of the source follower element,
wherein the floating diffusion, the reset element and the source follower element are formed in the first substrate, and
wherein the current source is formed in the first substrate or the second substrate.

22. A method for driving a solid-state imaging device, the solid-state imaging device including:
a pixel part having a pixel arranged therein, the pixel performing photoelectric conversion; and
a reading part for reading a pixel signal from the pixel in the pixel part,
wherein the pixel includes:
a photoelectric conversion element for storing therein, in a storing period, charges generated by the photoelectric conversion;
a transfer element for transferring, in a transfer period following the storing period, the charges stored in the photoelectric conversion element;
an output node to which the charges stored in the photoelectric conversion element are transferred through the transfer element;
an output buffer part for converting the charges at the output node into a voltage signal at a level determined by the amount of the charges and outputting the voltage signal;
a charge storing part for storing overflow charges overflowing at least from the photoelectric conversion element to the output node;
a comparator for performing a comparing operation of comparing the voltage signal output from the output buffer part against a referential voltage to output a digital comparison result signal; and
a memory part for saving data corresponding to the comparison result signal from the comparator, wherein when the pixel signal is read out from the pixel, the comparator performs:

under control of the reading part, a first comparing operation of outputting a digital first comparison result signal obtained by processing the voltage signal corresponding to the overflow charges overflowing from the photoelectric conversion element to the output node in the storing period;

a second comparing operation of outputting a digital second comparison result signal obtained by processing the voltage signal corresponding to charges stored in the photoelectric conversion element that are transferred to the output node in the transfer period following the storing period; and a third comparing operation of outputting a digital third comparison result signal obtained by processing the voltage signal corresponding to a sum of (i) the charges stored in the photoelectric conversion element that are transferred to the output node in the transfer period following the storing period and (ii) charges stored in the charge storing part, and wherein whether or not to allow writing of data corresponding to the third comparison result signal obtained as a result of the third comparing operation into the memory part is controlled depending on a state of the first comparison result signal obtained as a result of the first comparing operation and a state of the second comparison result signal obtained as a result of the second comparing operation, so that access to the memory part is controlled depending on a state of the comparison result signal from the comparator.

23. An electronic apparatus comprising:

a solid-state imaging device; and an optical system for forming a subject image on the solid-state imaging device, wherein the solid-state imaging device includes:

a pixel part having a pixel arranged therein, the pixel performing photoelectric conversion; and a reading part for reading a pixel signal from the pixel in the pixel part, wherein the pixel includes:

a photoelectric conversion element for storing therein, in a storing period, charges generated by the photoelectric conversion;

a transfer element for transferring, in a transfer period following the storing period, the charges stored in the photoelectric conversion element;

an output node to which the charges stored in the photoelectric conversion element are transferred through the transfer element;

an output buffer part for converting the charges at the output node into a voltage signal at a level determined by the amount of the charges and outputting the voltage signal;

a charge storing part for storing overflow charges overflowing at least from the photoelectric conversion element to the output node;

a comparator for performing a comparing operation of comparing the voltage signal output from the output buffer part against a referential voltage to output a digital comparison result signal;

a memory part for saving data corresponding to the comparison result signal from the comparator; and a memory control part for controlling access to the memory part depending on a state of the comparison result signal from the comparator, wherein, under control of the reading part, the comparator is configured to perform:

a first comparing operation of outputting a digital first comparison result signal obtained by processing the voltage signal corresponding to the overflow charges overflowing from the photoelectric conversion element to the output node in the storing period;

a second comparing operation of outputting a digital second comparison result signal obtained by processing the voltage signal corresponding to charges stored in the photoelectric conversion element that are transferred to the output node in the transfer period following the storing period; and a third comparing operation of outputting a digital third comparison result signal obtained by processing the voltage signal corresponding to a sum of (i) the charges stored in the photoelectric conversion element that are transferred to the output node in the transfer period following the storing period and (ii) charges stored in the charge storing part, and wherein the memory control part controls whether or not to allow writing of data corresponding to the third comparison result signal obtained as a result of the third comparing operation into the memory part, depending on a state of the first comparison result signal obtained as a result of the first comparing operation and a state of the second comparison result signal obtained as a result of the second comparing operation.

* * * * *